United States Patent
Dibra

(10) Patent No.: US 9,444,027 B2
(45) Date of Patent: Sep. 13, 2016

(54) THERMOELECTRICAL DEVICE AND METHOD FOR MANUFACTURING SAME

(75) Inventor: Donald Dibra, Munich (DE)

(73) Assignee: Infineon Technologies AG, Neubiberg (DE)

(*) Notice: Subject to any disclaimer, the term of this patent is extended or adjusted under 35 U.S.C. 154(b) by 928 days.

(21) Appl. No.: 13/252,271

(22) Filed: Oct. 4, 2011

(65) Prior Publication Data
US 2013/0081662 A1   Apr. 4, 2013

(51) Int. Cl.
| H01L 35/32 | (2006.01) |
| H01L 35/34 | (2006.01) |
| H01L 27/16 | (2006.01) |
| H01L 23/38 | (2006.01) |

(52) U.S. Cl.
CPC .............. *H01L 35/32* (2013.01); *H01L 23/38* (2013.01); *H01L 27/16* (2013.01); *H01L 35/34* (2013.01); *H01L 2224/16* (2013.01)

(58) Field of Classification Search
CPC combination set(s) only.
See application file for complete search history.

(56) References Cited

U.S. PATENT DOCUMENTS

| 5,059,543 | A | | 10/1991 | Wise et al. |
| 5,956,569 | A | * | 9/1999 | Shiu et al. ................... 438/48 |
| 6,252,154 | B1 | | 6/2001 | Kamada et al. |
| 6,300,554 | B1 | | 10/2001 | Du et al. |
| 6,310,383 | B1 | | 10/2001 | Watanabe et al. |
| 6,404,042 | B1 | | 6/2002 | Sone et al. |
| 6,784,073 | B1 | | 8/2004 | Fisher |
| 6,800,933 | B1 | | 10/2004 | Mathews et al. |
| 7,842,922 | B2 | | 11/2010 | Leneke et al. |
| 7,871,847 | B2 | | 1/2011 | Moczygemba |
| 2006/0090885 | A1 | * | 5/2006 | Montgomery .......... F28D 15/02 165/104.33 |
| 2008/0017356 | A1 | * | 1/2008 | Gruss .................... H01L 23/427 165/104.33 |
| 2008/0283110 | A1 | * | 11/2008 | Jin et al. ...................... 136/206 |
| 2009/0025772 | A1 | * | 1/2009 | Dannoux ................ F01N 5/025 136/205 |
| 2009/0056345 | A1 | | 3/2009 | Edwards et al. |
| 2009/0093078 | A1 | | 4/2009 | Moczygemba |
| 2009/0217961 | A1 | * | 9/2009 | Chen et al. .................. 136/205 |
| 2011/0023929 | A1 | | 2/2011 | Edwards |
| 2011/0291269 | A1 | * | 12/2011 | Griebenow et al. ........ 257/737 |
| 2012/0017962 | A1 | * | 1/2012 | Skotnicki et al. ........... 136/201 |

FOREIGN PATENT DOCUMENTS

| DE | 102006055263 A1 | 5/2008 |
| JP | H11298053 A | 10/1999 |
| WO | 2010010520 A2 | 1/2010 |

OTHER PUBLICATIONS

Phillips, Herbert, "The infrared optical properties of SiO2 and SiO2 layers on silicon" Journal of Applied Physics 50, 1053 (1979).*
Handbook of Chemistry and Physics 95th Edition (2014-2015), Section 12 pp. 212-213.*

(Continued)

*Primary Examiner* — Jennifer Michener
*Assistant Examiner* — Christopher Danicic
(74) *Attorney, Agent, or Firm* — Eschweiler & Associates, LLC

(57) ABSTRACT

A method for manufacturing a thermoelectrical device includes providing a substrate and also forming at least one deep trench into the substrate. The method further includes forming at least one thermocouple which comprises two conducting paths, wherein a first conducting path comprises a first conductive material and a second conducting path comprises a second conductive material, such that at least the first conducting path is embedded in the deep trench of the substrate.

16 Claims, 28 Drawing Sheets

(56) References Cited

OTHER PUBLICATIONS

"Physical and electrical properties of FC-77 and FC-770" http://ppd-docdb.fnal.gov/cgi-bin/RetrieveFile?docid=2080&filename=fluid_properties.pdf&version=2.*

"SCS Parylene Properties", http://www.physics.rutgers.edu/~podzorov/ parylene%20properties .pdf.*

Mahan, et al, "Infrared absorption of thin metal films: Pt on Si", Appl. Phys. Lett., vol. 42, No. 3, Feb. 1, 1983.*

Atkin, T., et al. "CMOS-based Thermal Sensors." Advanced Micro and Nanosystems vol. 2. CMOS-MEMS. 2005. 34 Pages.

Van Herwaarden, A.W., et al. "Thermal Sensors Based on the Seebeck Effect." Sensors and Actuators, 10 (1986) 321-346. 26 Pages.

Tellurex. "Frequently Asked Questions About Our Cooling and Heating Technology." http://www.tellurex.com/technology/peltier-faq.php#top Accessed on Dec. 6, 2011. 20 Pages.

English Abstract from Marc Strasser's "Entwicklung und Charakterisierung mikrostrukturierter thermoelektrischer Generatoren in Silizium-Halbleitertechnologie", Dissertation, TU MOnchen, Shaker Verlag, 2004. 3 Pages.

* cited by examiner

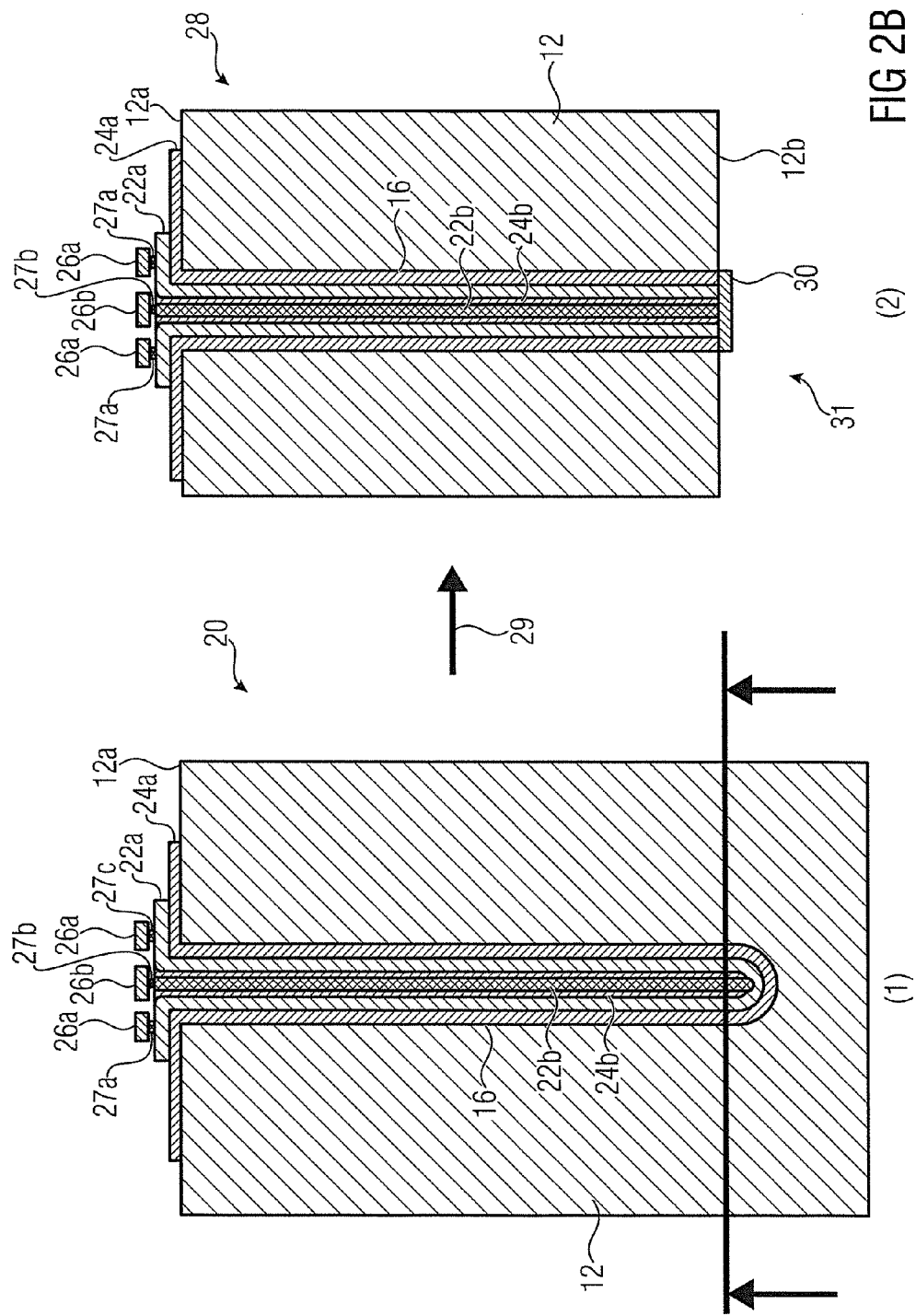

THERMOELECTRICAL DEVICE AND METHOD FOR MANUFACTURING SAME

FIELD

Embodiments of the invention refer to a method for manufacturing a thermoelectrical device and to a thermoelectrical device. In particular, embodiments of the invention refer to a thermoelectrical device with an embedded integrated circuit, an energy harvesting system, a heat transfer device and a thermosensor.

BACKGROUND

A thermoelectrical device usually comprises a thermocouple consisting of two conducting paths with two different conductive materials. The two conductive materials may be different metal alloys (e.g. chrome) and iron) or different semiconductors or a combination of a semiconductor and a metal alloy (e.g. p-doped silicon and copper). At a first end of the thermocouple, the two (parallel) conducting paths are electrically connected to each other so that a material-junction of the thermocouple is generated. At the second end, the two conducting paths are not connected so that there are two open contact points. Between the two open contact points a voltage $V_{AB}$, also referred to as the Seebeck voltage, is generated in case of a temperature gradient between the first and second end of the thermocouple.

The fields of applications for such a thermocouple or such a thermoelectrical device based on the Seebeck effect is manifold. The thermoelectrical device may be used as a thermosensor for measuring the temperature difference between two points, namely the two ends of the thermocouple. Furthermore, the thermoelectrical device can be used as a thermoelectrical generator (TEG) for generating electrical energy. The underlying physical effect may be inverted so that a temperature difference may be generated between the two ends of the thermoelectrical device in response to an applied current between the two contact points of the two conducting paths. This application is called a thermoelectric cooler and heater (TECH) or Peltier element. Thermoelectrical devices and especially miniaturized thermoelectrical devices may be produced by semiconductor manufacturers.

SUMMARY

Embodiments of the invention provide a method for manufacturing a thermoelectrical device. The method comprises providing a substrate and forming at least one deep trench into the substrate, and forming at least one thermocouple which comprises two conducting paths. A first conducting path comprises a first conductive material and a second conducting path comprises a second conductive material such that at least the first conducting path is embedded in the deep trench of the substrate.

Further embodiments provide a thermoelectrical device comprising a substrate which comprises at least one deep trench from a first main surface into the substrate. This thermoelectrical device further comprises at least one thermocouple which comprises two conducting paths, wherein a first conducting path comprises a first conductive material and a second conducting path comprises a second conductive material, and wherein at least the first conducting path is embedded in the deep trench of the substrate.

An embodiment provides a thermoelectrical device with an embedded integrated circuit which comprises a substrate comprising at least one deep trench that extends from a first main surface into the substrate. The thermoelectrical device comprises at least one thermocouple, which comprises two conducting paths, wherein a first conducting path comprises a first conductive material and a second conducting path comprising a second conductive material, and wherein at least the first conducting path is embedded in the deep trench of the substrate. This thermoelectrical device further comprises the integrated circuit arranged on the first main surface or on a second opposing main surface.

An embodiment provides an energy harvesting system comprising a substrate which comprises at least one deep trench that extends from a first main surface into the substrate. This thermoelectrical device comprises at least one thermocouple which comprises two conducting paths, wherein a first conducting path comprises a first conductive material and a second conducting path comprises a second conductive material, and wherein at least the first conducting path is embedded in the deep trench of the substrate. This energy harvesting system is configured to convert a temperature difference between the first and a second opposing main surface into electrical energy. The energy harvesting system further comprises a capacitor configured to store the electrical energy.

An embodiment provides a heat transfer device comprising a substrate which comprises at least one deep trench that extends from a first main surface into the substrate. The heat transfer device further comprises a thermocouple which comprises two conducting paths, wherein a first conducting path comprises a first conductive material and a second conducting path comprises a second conductive material, and wherein at least the first conducting path is embedded in the deep trench of the substrate. The heat transfer device is configured to generate a temperature difference between the first and a second opposing main surface in response to an applied current between the first and the second conducting path.

A further embodiment provides a thermosensor comprising a substrate which comprises at least one deep trench that extends from a first main surface into the substrate. The thermosensor comprises at least one thermocouple which comprises two conducting paths, wherein a first conducting path comprises a first conductive material and a second conducting path comprises a second conductive material, and wherein at least the first conducting path is embedded in the deep trench of the substrate. The thermocouple comprises an infrared absorbing layer arranged on the first main surface wherein the thermocouple is configured to apply a current between the first and the second conducting path in response to a change in temperature within the infrared absorbing layer caused by infrared light.

BRIEF DESCRIPTION OF THE DRAWINGS

In the following, embodiments of the invention will be described referring to the drawings.

FIGS. 2a-2d schematically show different embodiments of thermoelectrical devices for illustrating different material junctions;

DETAILED DESCRIPTION

Figure 1:
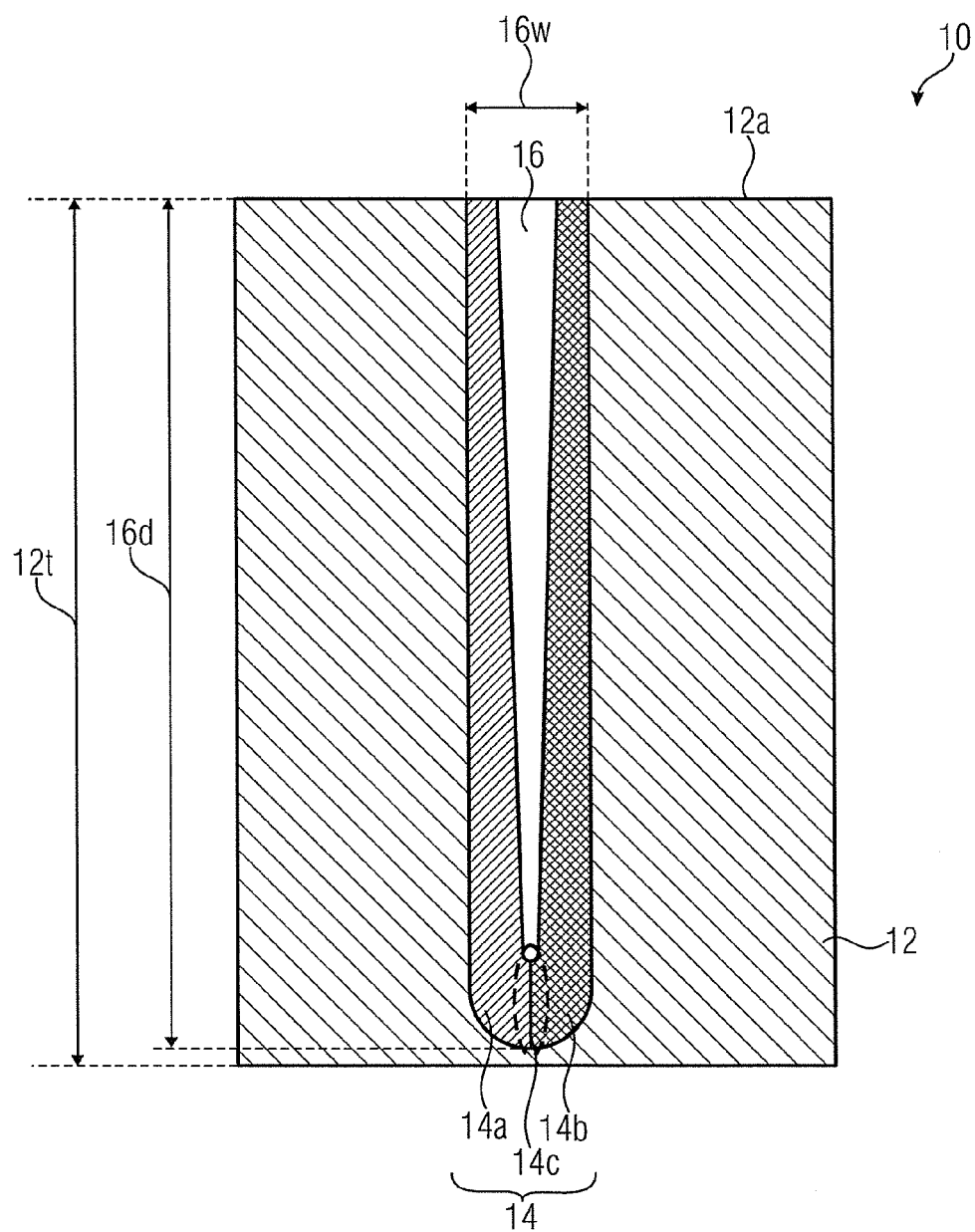
FIG. 1 schematically shows a cross-sectional view of a thermoelectrical device according to an embodiment.

Different embodiments of the invention will subsequently be discussed referring to FIG. 1 to FIG. 7. In advance, identical reference numerals are provided to objects having identical or similar functions so that objects referred to by identical reference numerals within the different embodiments are interchangeable and the description thereof is mutually applicable.

FIG. 1 shows a cross-sectional view of a thermoelectrical device 10. The thermoelectrical device 10 comprises a substrate 12, which may comprise silicon or another semiconductor, and a thermocouple 14 embedded in a deep trench 16 of the substrate 12. The deep trench 16 extends from a first main surface 12a perpendicularly into the substrate 12. The deep trench 16 may, in one embodiment, have a high aspect ratio such that a ratio between a depth 16d and a diameter or width 16w of the deep trench 16 is larger than 3:1 or larger than 5:1 or even larger than 10:1 or 20:1. As a consequence of the high aspect ratio 16d:16w of the deep trench 16, the internal walls of same are roughly in parallel to each other, e.g. within a range of 88°-92° (measured against a first main surface 12a of the substrate 12) in one embodiment.

The thermocouple 14 comprises two conducting paths 14a and 14b. The first conducting path 14a comprises a first conductive material, for example, n-doped polysilicon, while the second conducting path 14b comprises a second conductive material, for example, a p-doped polysilicon or a metal like copper or aluminum, which is different from the first conductive material. In this embodiment, the two conducting paths 14a and 14b are directly electrically connected in series at the bottom of the deep trench 16 such that a material-junction 14c of the two conductive materials is formed. Opposing to the material-junction 14c the two conducting paths 14a and 14b have two contact points arranged on the first main surface 12a of the substrate 12, while each of the two conducting paths 14a and 14b is isolated from one another along the deep trench 16.

The thermoelectrical device 10 may be used as a thermoelectric generator (TEG) or as a thermoelectric cooler and heater (TECH) or as a thermosensor (e.g. thermal radiation sensor or infrared sensor). These applications are based on the Seebeck effect. Due to the two different materials for the different conducting paths 14a and 14b, the Seebeck voltage $V_{AB}$ is generated between the two contact points in case of a temperature difference $\Delta T$ along the thermocouple 14 or the depth 16d of the deep trench 16. Vice versa, a temperature difference $\Delta T$ along the thermocouple 14 is generated in case of applying a voltage $V_{AB}$ to same. The Seebeck voltage $V_{AB}$ is proportional to the temperature gradient $\Delta T$ along the thermocouple 14 and dependent on the absolute Seebeck coefficient $\alpha_{AB}$ of the thermocouple 14. The voltage $V_{AB}$ may be calculated by the following formula:

$$a.\ V_{AB} = \alpha_{AB} \cdot \Delta T \quad (1)$$

The absolute Seebeck coefficient $\alpha_{AB}$, e.g. 160 mV/K, is equal to sum of the Seebeck coefficients $\alpha_A$ and $\alpha_B$ of both conducting paths 14a and 14b. The Seebeck coefficient of a metal, e.g. copper 1.8 μV/K and aluminum −1.7 μV/K, is lower compared to Seebeck coefficients of silicon. Doped silicon has a Seebeck coefficient of up to 1.5 mV/K, wherein a p-type silicon has a positive Seebeck coefficient and a n-type silicon has a negative Seebeck coefficient. The values of the Seebeck coefficients of doped semiconductors depend on the doping concentration so that highly doped silicon has a lower Seebeck coefficient than a lowly doped one. In other words, the variation of the doping concentration allows a trade-off between the Seebeck coefficient, the specific electrical resistivity (e.g. 1.5 mOhm/cm) and the thermal conductivity leading to an optimum figure of merit.

The high aspect ratio 16d:16w of the deep trench 16, e.g. up to 3:1 or 5:1 or up to 20:1 as well as any ranges in-between these aspect ratios, enables the deep trench 16 and thus the thermocouple 14 extend over a wide reach (e.g. up to 90% or up to 95%) of the thickness 12t of the substrate 12 (16d≥0.9×12t). As a consequence of this, the temperature gradient $\Delta T$ between the bottom of the deep trench 16 and the first main surface 12a of the substrate 12 is larger compared to a conventional thermocouple embedded in a normal trench. Thus, it is beneficial that the efficiency of the illustrated thermoelectrical device 10 is increased compared to a conventional thermoelectrical device having the same size. Furthermore, each thermocouple 14 has a reduced need for space of the substrate 12 due to the small diameter or width 16w of the deep trench 16 when compared to a conventional thermocouple.

Below, a method for manufacturing the thermoelectrical device 10 will be described. The method basically comprises three steps: after the first step of providing the substrate 12, the deep trench 16 is formed into the substrate 12 during the second step. The deep trench 16 is provided, for example, by deep trench etching or reactive-ion etching in order to form the deep trench 16 having the high aspect ratio as described above. The etching may be performed such that the deep trench 16 extends from the first main surface 12a to the depth 16d of the deep trench 16 of the thickness 12t of the substrate 12 at least 90% or even 95% (as well as any ranges in-between these values) of the thickness 12t of the substrate 12. After that, the thermocouple 14 is provided, e.g. by depositing or filling, such that at least one of the two conducting paths 14a and 14b is embedded in a deep trench 16. In this embodiment, the two conducting paths 14a and 14b are formed in the deep trench 16 such that the two conducting paths 14a and 14b are directly electrically connected in series at the bottom of the deep trench 16 in order to form the material-junction 14c. It is an advantage that the thermoelectrical device 10 may be manufactured by using semiconductor process means, for example CMOS processes. Therefore, the fabrication of the thermoelectrical device 10 is reliable and feasible for mass market leading to a reduction of production costs.

It should be noted that the two conducting paths are not necessarily embedded in the one single deep trench 16. Alternatively, one of the two conducting paths 14a and 14b may be embedded in a second trench or deep trench of the substrate 12 such that the two conducting paths 14a and 14b are electrically connected or one of the two conducting paths may be formed by a conductive substrate, as will be described referring to the below embodiments. The core of the invention is to integrate the thermoelectrical device 10 by using deep trench technology and, in particular, by deep trench etching of the substrate 12. According to embodiments, the deep trench process may be combined with CMOS processes, e.g. CMOS micro machining, enabling a system on a chip, e.g. an energy harvesting system combining a thermoelectric generator and a DC/DC converter on a single chip.

Figure 2A:
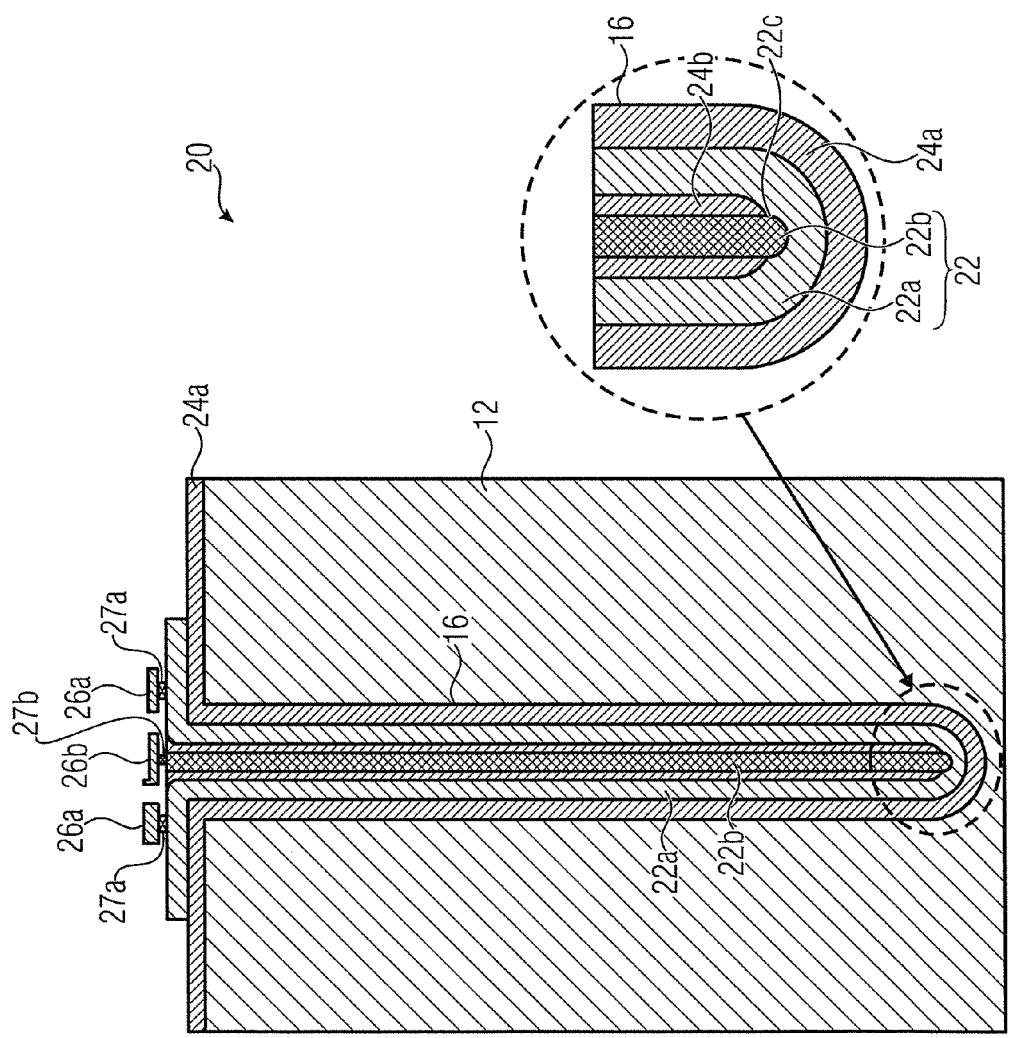
Figure 2C:
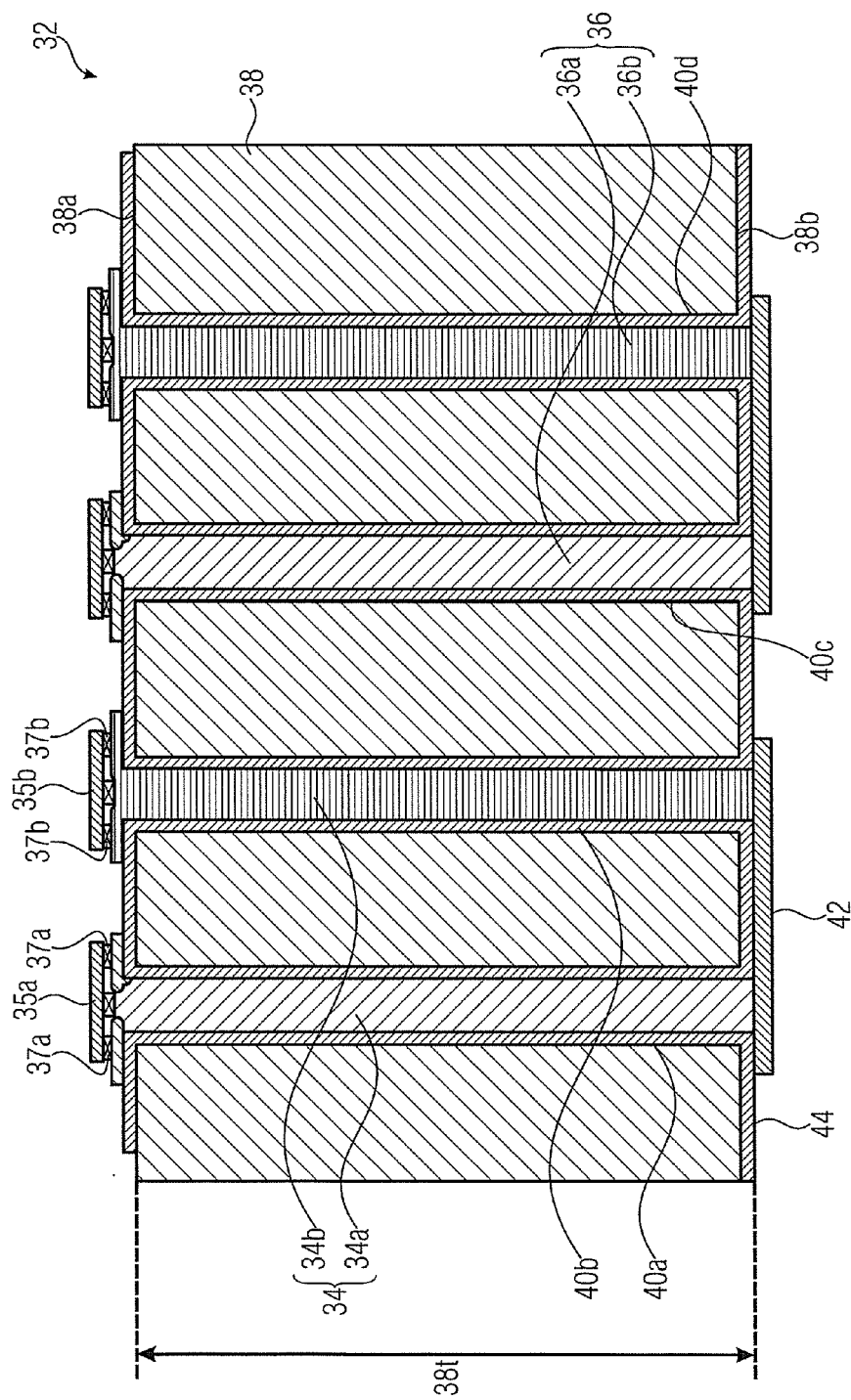
Figure 2D:
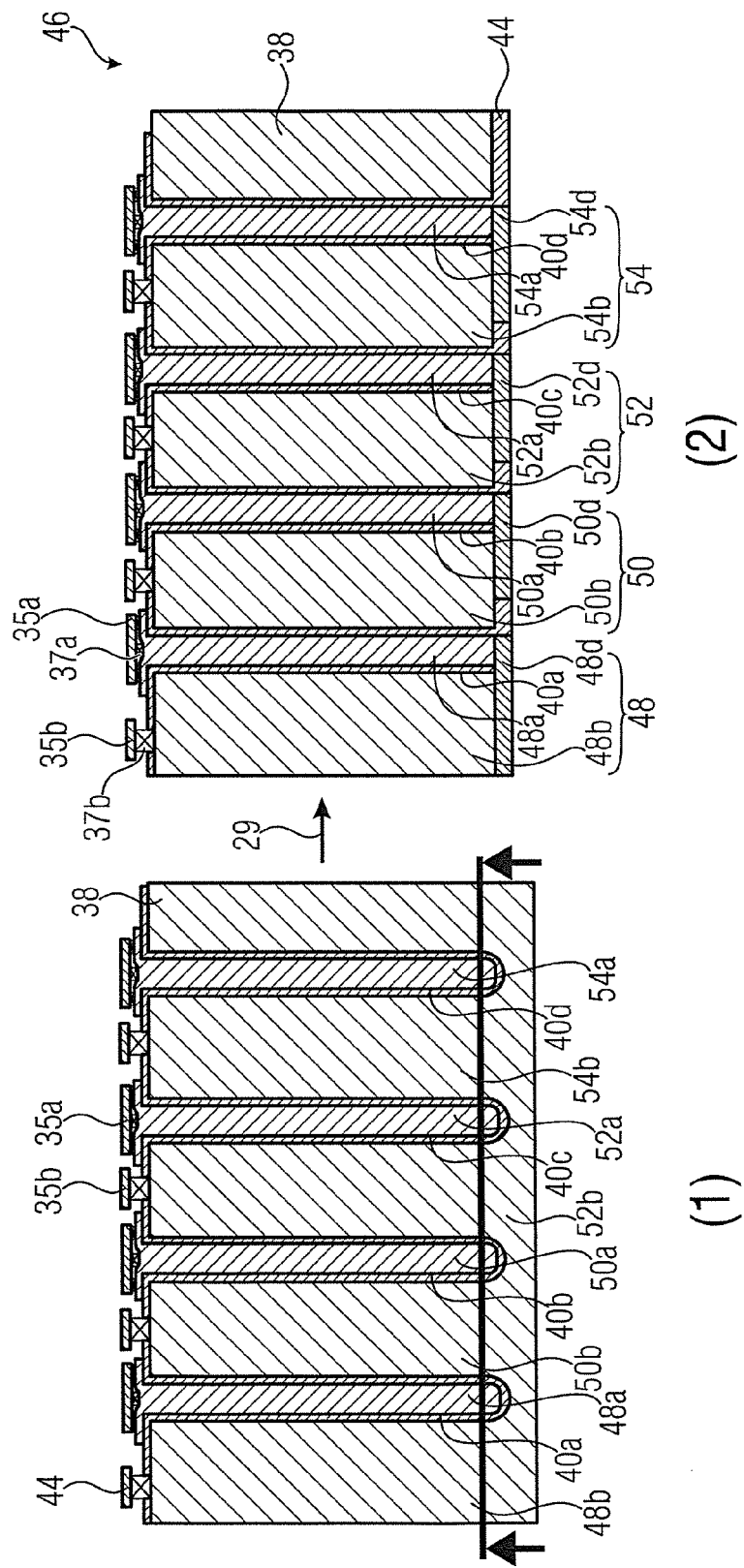

Referring to FIGS. 2a-2d four different embodiments of thermoelectrical devices will be discussed in which a material-junction is formed in a variety of ways. FIG. 2a shows a thermoelectrical device comprising two directly connected conducting paths, while FIGS. 2b-2d show thermoelectrical devices connected by using a connecting pad.

FIG. 2a shows a cross-sectional view of a thermoelectrical device 20, which corresponds roughly to the thermoelectrical device 10 shown in FIG. 1. In this embodiment, a thermocouple 22 is embedded in the deep trench 16 of the substrate 12. The deep trench 16 has the shape of a (test) tube, so it has a round cross-section and its bottom is rounded. A first conducting path 22a of the thermocouple 22 is embedded in the deep trench 16, while a second conducting path 22b is embedded in the first conducting path 22a. Thus, the conducting path 22b is in parallel with the conducting path 22a. The first conducting path 22a (e.g. comprising n- or p-doped polysilicon) is isolated from the substrate 12 by an insulating layer 24a which may comprise silicon oxide. The second internal conducting path 22a (e.g. comprising a metal like copper) is isolated from the first external (surrounding) conducting path 22a almost along the entire length of the two conducting paths 22a and 22b by an insulating layer 24b. At the bottom of the deep trench 16 the two conducting paths 22a and 22b are directly electrically connected to generate a material-junction 22c. The material-junction 22c is formed by the second conducting path 22b (or by a head of the second conducting path 22b) extending through the insulating layer 24b into the first conducting path 22a.

Furthermore, the first conducting path 22a comprises two contact points 26a and the second conducting path 22b comprising a contact point 26b for electrically connecting the thermoelectrical device 10, for example, with an external circuit (not shown). The three contact points 26a and 26b are arranged at the first main surface 12a and electrically connected to the respective conducting path 22a or 22b via a contact 27a and 27b. The contact points 26a and 26b may comprise a metal like copper or aluminum.

Regarding functionality, the thermoelectrical device 20 is equal to the thermoelectrical device 10 of FIG. 1. In contrast to the embodiment of FIG. 1, the method for manufacturing the thermoelectrical device 20 may comprise the following steps: after the deep trench 16 has been etched into the substrate 12, the first insulating layer 24a is provided by deposition of the same into the deep trench 16. After that the first conducting path 22a is provided by the deposition of a first doped polysilicon layer on the first insulating layer 24a. The next steps are deposition of the second insulating layer 24b on the first polysilicon layer 22a and filling the trench with a second doped polysilicon layer in order to provide the second conducting path 22b. The last step comprises a sub-step of electrically connecting the two conducting paths 22a and 22b in series such that the material-junction 22c is formed.

FIG. 2b illustrates the difference of a direct connection of two conducting paths 22a and 22b and of a connection via a connection pad. Therefore, FIG. 2b shows in a first cross-sectional view (1) the thermoelectrical device 20 according to FIG. 2a and in a second cross-sectional view (2) a thermoelectrical device 28 which is similar to the thermoelectrical device 20. The electrical connection between the conducting paths 22a and 22b of the thermoelectrical device 28 is formed by a connection pad 30 at an etched second main surface 12b opposing the first surface 12a. Therefore, the trench 16 and thus two conducting paths 22a and 22b of the thermocouple 22 extend over the entire thickness 12t of the substrate 12. The two conducting paths 22a and 22b in combination with the connection pad 30 form the thermocouple 31. The connection pad 30 may comprise a metal, while the first conducting path 22a may comprise n-doped polysilicon and the second conducting path 22b a p-doped polysilicon.

In this embodiment, the method for manufacturing the thermoelectrical device 28 comprises two further steps (illustrated by an arrow 29): after the two conducting paths 22a and 22b have been provided the second main surface 12b of the substrate 12 is etched by backside etching such that the two conducting paths 22a and 22b are exposed. After that the metal connection pad 30 is arranged at the second main surface 12b. These steps may comprise a first sub-step of chemical-mechanical polishing of the second main surface 12b until both conducting paths 14a and 14b are exposed (and the second main surface 12b is planarized). The second sub-step is a metal deposition and structuring or patterning of the metal on the wafer backside 12b to form the connection pad 30 of the thermocouple 31.

FIG. 2c shows a cross-sectional view of a thermoelectrical device 32 comprising a plurality of thermocouples, namely two thermocouples 34 and 36. The two thermocouples 34 and 36 are formed within a substrate 38 that comprises four deep trenches 40a, 40b, 40c, and 40d that extend from a first main surface 38 over an entire thickness 38t of the substrate 38. Each thermocouple 34 and 36 is formed by two conducting paths 34a, 34b and 36a, 36b, respectively. In this embodiment, each conducting path 34a, 34b, 36a, and 36b is embedded in the respective deep trench 40a, 40b, 40c and 40d.

In the following, the thermocouple 34 will be discussed in place of the two similar thermocouples 34 and 36. The two conducting paths 34a and 34b of the thermocouple 34 comprise two different conductive materials, for example n-doped polysilicon and p-doped polysilicon. Here, the conducting path 34a is embedded in the deep trench 40a and the conducting path 34b is embedded in the deep trench 40b, wherein the two conducting paths 34a and 34b are electrically connected by using a metal connection pad 42 arranged on a second main surface 38b opposing to the first main surface 38a. The conducting paths 34a, 34b and the connection pad 42 are isolated from the substrate 38 by an insulating layer 44 which covers the first main surface 38a and the second main surface 38b as well as the internal walls of the deep trenches 40a, 40b, 40c and 40d. The conducting paths 34a and 34b are connectable via a contact point 35a and 35b, respectively, at the first main surface 38a. The contact points 35a and 35b are arranged on the respective conducting paths 34a and 34b and are electrically connected with same via contacts 37a and 37b.

Regarding functionality, the thermoelectrical device corresponds to the thermoelectrical devices 10, 20 and 28. Regarding manufacturing, the thermoelectrical device 32 substantially corresponds to the thermoelectrical device 28. In this embodiment, the plurality of deep trenches 40a, 40b, 40c and 40d are formed into the substrate 38 before depositing the insulating layer 44 and the different materials of the conducting paths 34a, 36a and 34b, 36b, respectively. The conducting paths 34a, 34b, 36a, and 36b are exposed by backside etching before connecting same by using the connection pads 42, as described above.

FIG. 2d shows in a first cross-sectional view (1) a semi-finished thermoelectrical device 46 (for illustrating the step 29 of arranging connecting pads, c.f. FIG. 2b). FIG. 2d shows in a second cross-sectional view (2) the thermoelectrical device 46 which is similar to the thermoelectrical device 32. The thermoelectrical device 46 comprises four thermocouples 48, 50, 52 and 54 that are embedded in the substrate 38. The substrate 38 comprises the four deep trenches 40a, 40b, 40c and 40d, wherein the insulating layer 44 is arranged on the first main surface 38a as well as on the internal walls of the deep trenches 40a, 40b, 40c and 40d. In this embodiment, respective first conducting paths 48a, 50a, 52a and 54a are formed by conductive material (e.g. p-doped polysilicon) with which the respective deep trenches 40a, 40b, 40c and 40d are filled, while respective second conducting paths 48b, 50b, 52b and 54 are formed by a portion 48b, 50b, 52b and 54b of the substrate 38. Therefore, the substrate 38 is conductive and may comprise n-doped silicon. The portions 48b, 50b, 52b and 54b of the substrate 38 may be insulated from each other by the insulating layer 44.

In order to electrically connect the respective first conducting path 48a, 50a, 52a and 54a with the respective second conducting path (adjacent portion of the substrate 38) 48b, 50b, 52b and 54b, four metal connection pads 48d, 50d, 52d and 54d are arranged between the two respective conducting paths 48a and 48b, 50a and 50b, 52a and 52b as well as 54a and 54b. The connection pads 48d, 50d, 52d and 54d are isolated from each other by the insulating layer 44. The electrical connection of the singular conducting paths 48a, 48b, 50a, 50b, 52a, 52b, 54a and 54b is realized by contact points 35a and 35b via the contacts 37a and 37b at the first main surface 38a in accordance with the embodiment of FIG. 2c. It should be noted that the contact points 35b are arranged on the substrate 38, wherein the contacts 37b extend through the insulating layer 44. The thermoelectrical device 46 corresponds to the thermoelectrical device 32 regarding functionality and manufacturing, wherein the substrate 38 comprises a conductive or semiconductive material.

Referring to FIGS. 3a to 3g, different embodiments of thermoelectrical devices will be described, wherein a means for reducing the thermal conductivity is provided to each thermoelectrical device.

Figure 3A:
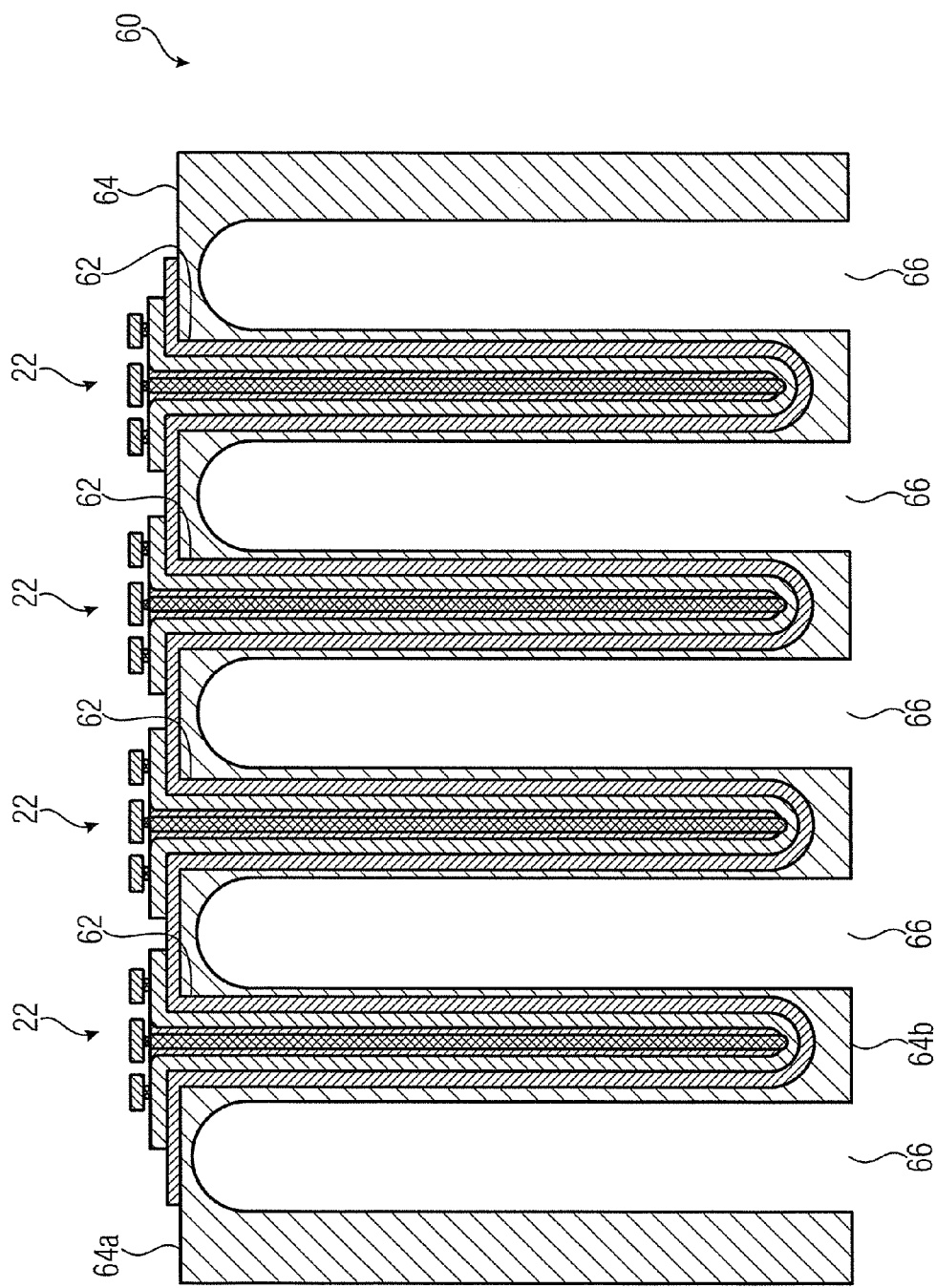
FIGS. 3a-3g schematically show embodiments of thermoelectrical devices with a backside etched substrate in order to reduce the thermal conductivity of the thermoelectrical devices.

FIG. 3a shows a cross-sectional view of a thermoelectrical device 60 which comprises a plurality of laterally arranged thermocouples 22 according to FIG. 2a. The four thermocouples 22 are arranged side by side within the substrate 38 and embedded in the four deep trenches 16 parallel extending from the first main surface 38a into the substrate 38. The thermal conductivity of the thermoelectrical device 60 is reduced by one or more openings 66 which may comprise air or vacuum. The plurality of the openings 66 are formed to the substrate 38, wherein each opening 66 extends from the second main surface 38b, so the openings 66 are between the deep trenches 16 and in parallel with same. The openings 66 extend over at least 80% or even 90% of a thickness 38t of the substrate 38. Due to the openings 66 the thermal conductivity between the first main surface 38a and the second main surface 38b is decreased. As a consequence of this, the figure of merit z of the thermoelectrical device 60 is increased which is defined as $z=\alpha_{AB}^2/(\kappa \cdot \rho)$, where $\alpha_{AB}$ is the Seebeck coefficient, $\kappa$ is the thermal conductivity and $\rho$ is the electrical resistivity.

Figure 3B:
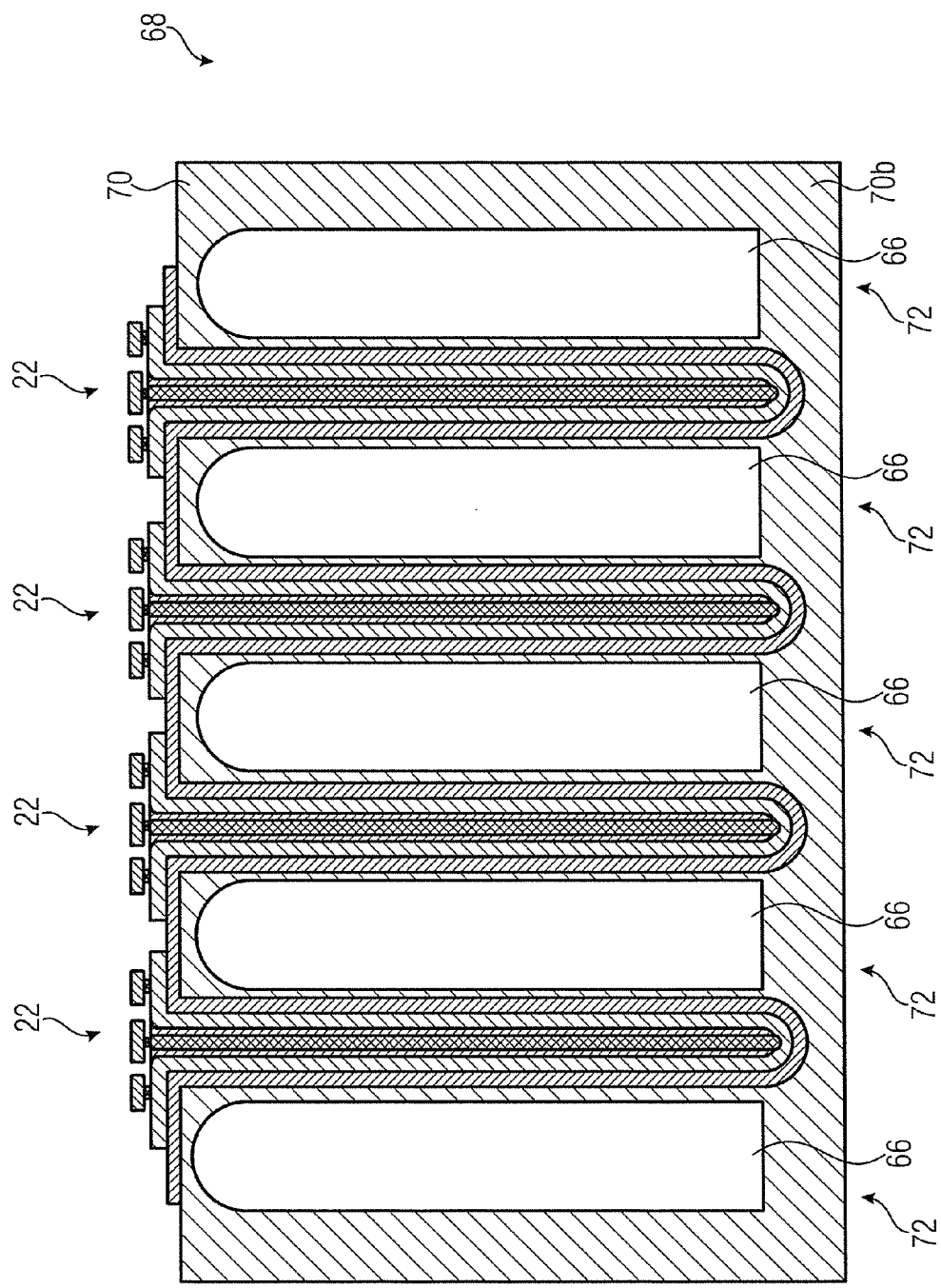

FIG. 3b shows a cross-sectional view of a thermoelectrical device 68 which is equal to the thermoelectrical device 68 according to FIG. 3a, wherein the substrate 38 comprises a sealing 72. The sealing 72 is arranged on the second main surface 38b such that the openings 66 are covered or partly covered by the sealing 72. Due to the sealing the mechanical stability of the thermoelectrical device 68 is increased compared to the thermoelectrical device 60 according to FIG. 3a.

Figure 3C:
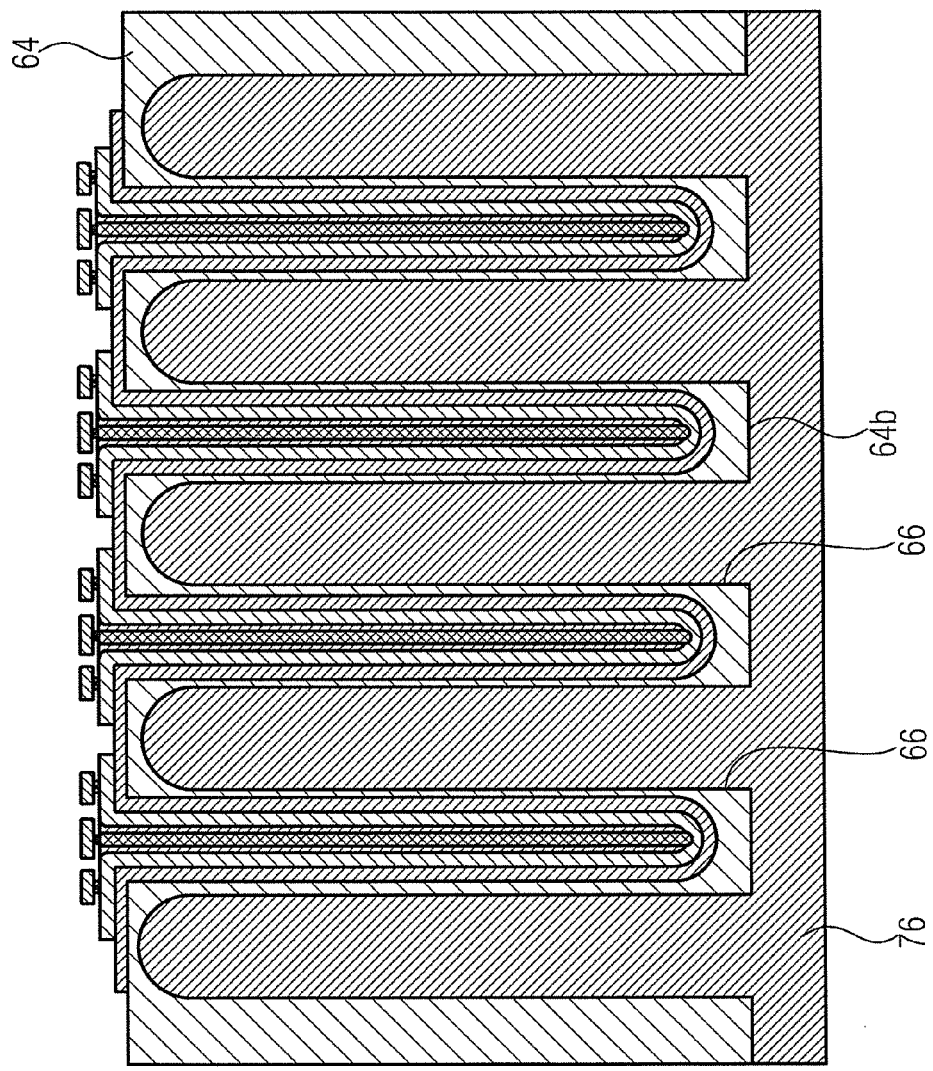

FIG. 3c shows a cross-sectional view of a thermoelectrical device 74 which is equal to the thermoelectrical device 60 according to FIG. 3a, but in contrast it further comprises a fill 76 of the openings 66. The fill 76 may comprise silicon oxide and has a reduced thermal conductivity when compared to the thermal conductivity of the substrate 38 or of the opening 66 without fill. The fill 76 is provided to the openings 66 at the second main surface 38b such that same is covered by the fill 76. The fill 76 also increases the mechanical stability of the thermoelectrical device 74.

Figure 3D:
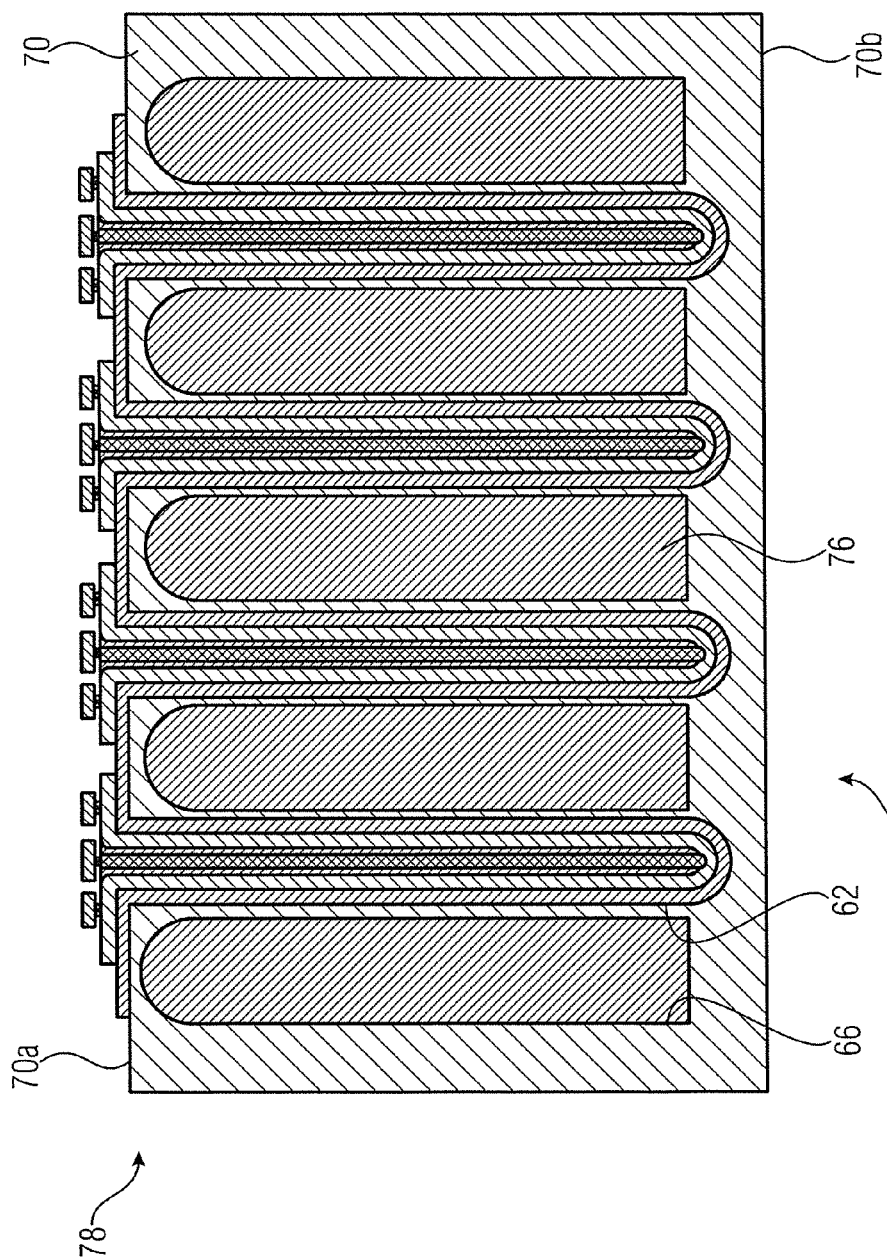

FIG. 3d shows a cross-sectional view of a thermoelectrical device 78 which is equal to the thermoelectrical device 68 according to FIG. 3b, but further comprises a fill 76. The fill 76 is provided to the openings 66 (between the first and second main surface 38a and 38b and between the deep trenches 16).

Figure 3E:
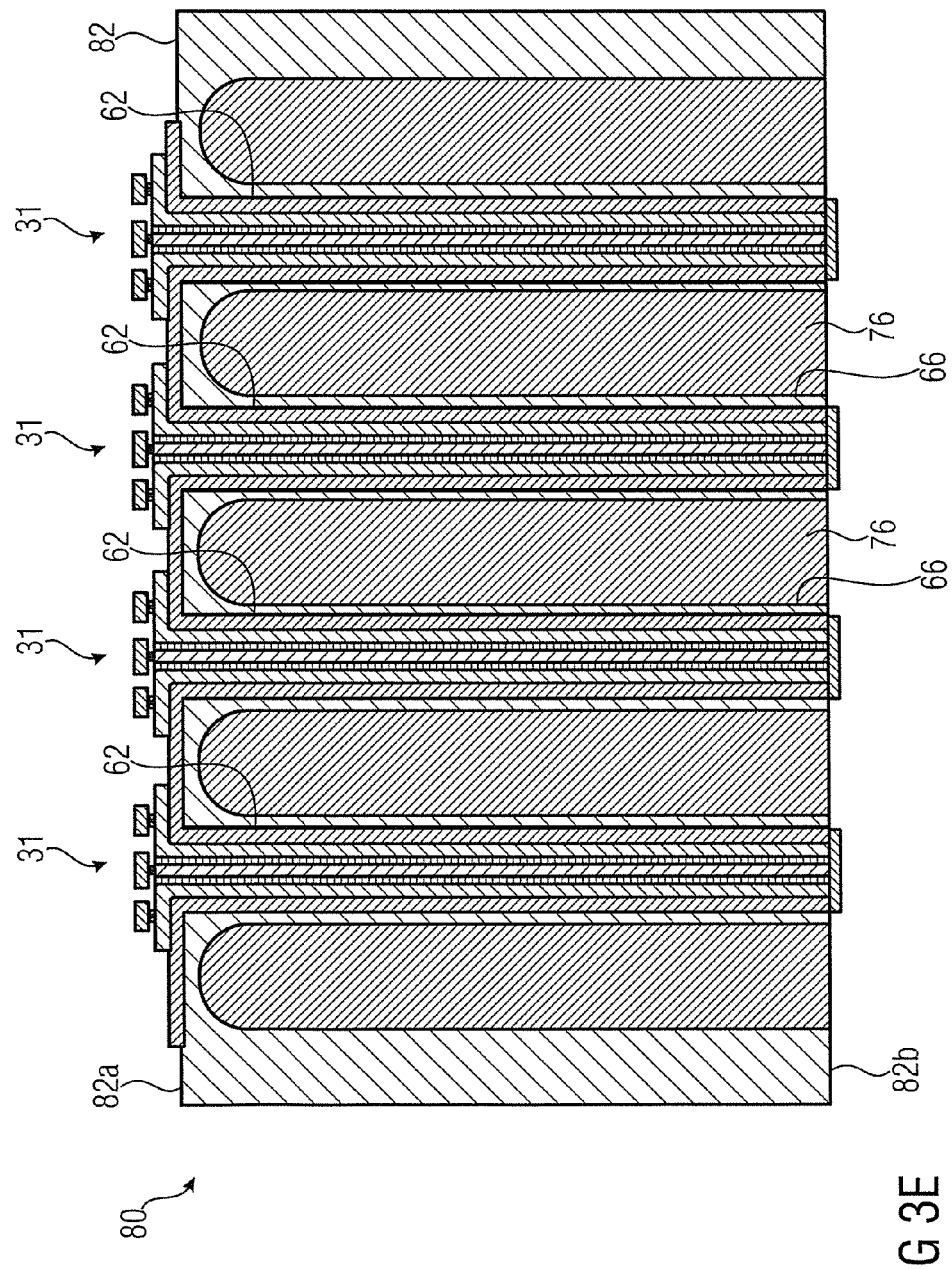

FIG. 3e shows a cross-sectional view of a thermoelectrical device 80 which comprises a plurality of thermocouples 31 according to FIG. 2b. The thermocouples 31 are arranged side by side in parallel to each other within the substrate 38. Between the thermocouples 31 which are embedded in the trenches 16 extending from the first main surface 38a openings 66 comprising a fill 76 according to FIG. 3c are arranged. In this embodiment the openings 66 extend from the second main surface 38b into the substrate 38.

Figure 3F:
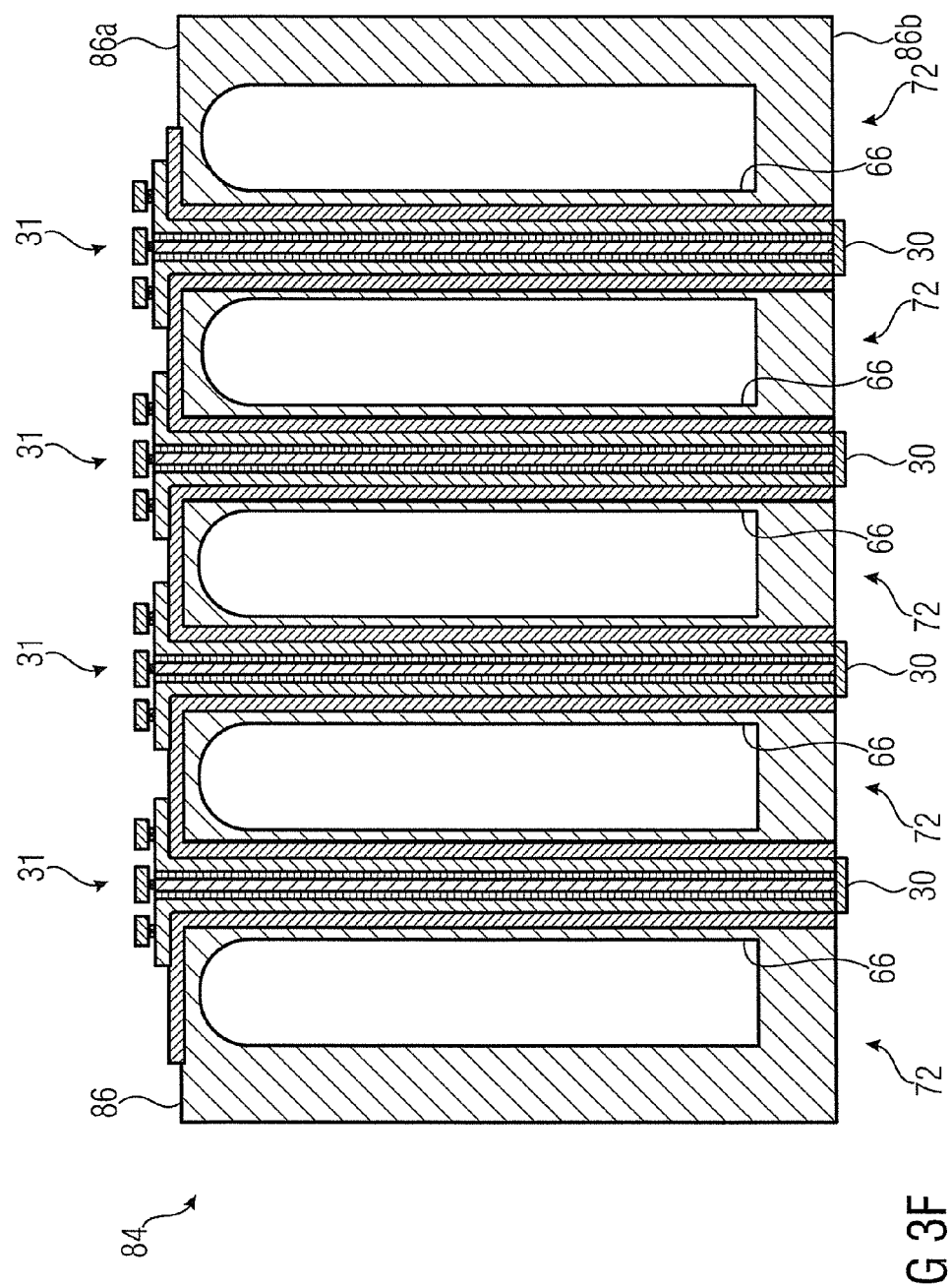

FIG. 3f shows a cross-sectional view of a thermoelectrical device 84 that is equal to the thermoelectrical device 80 according to FIG. 3e, wherein the thermoelectrical device 84 does not comprise the fill 76, but comprises the sealing 72 according to FIG. 3b. The sealing 72 is part of the substrate 38 of the thermoelectrical device 84 and forms the second main surface 38b.

Figure 3G:
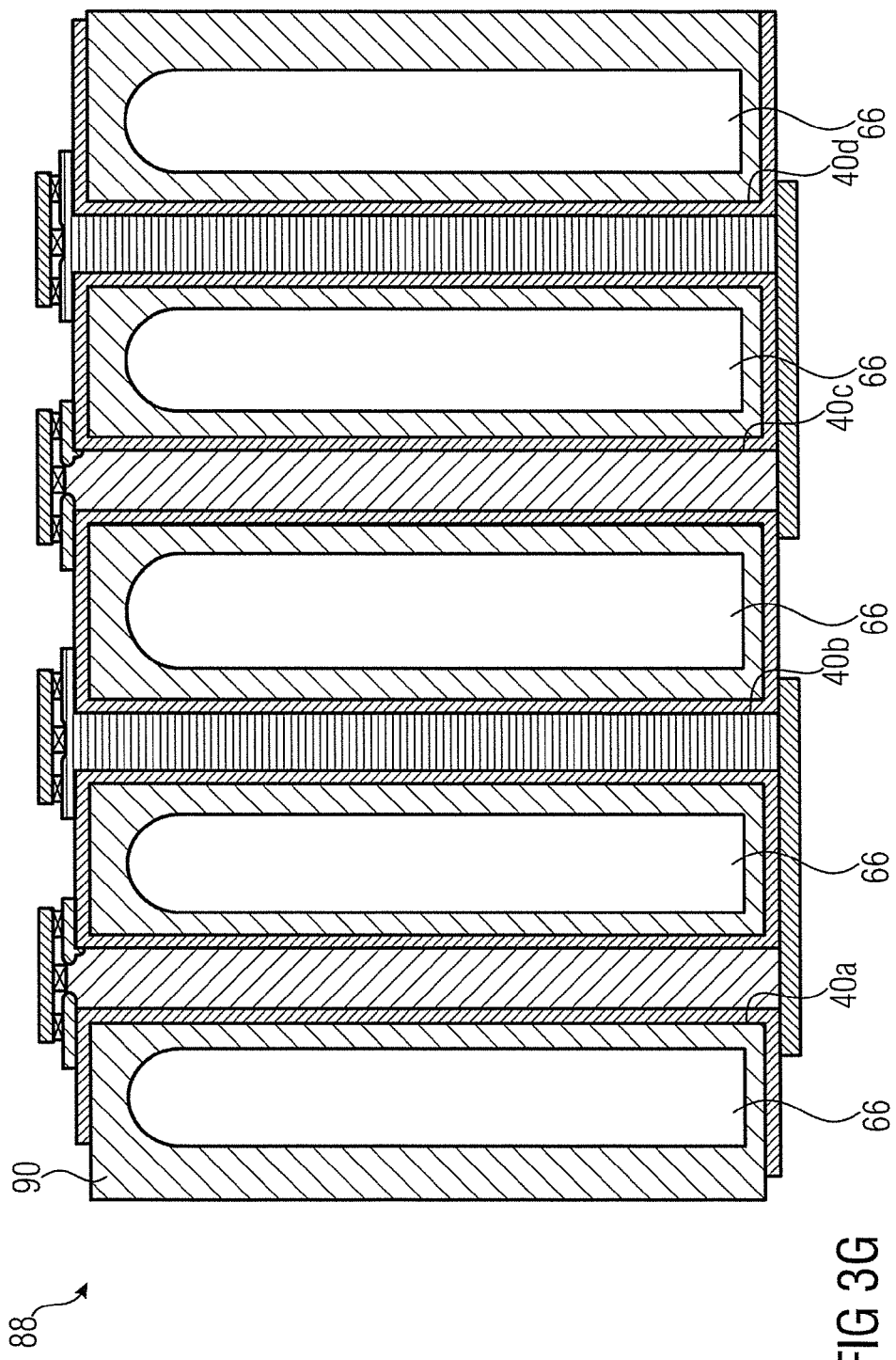

FIG. 3g shows a cross-sectional view of a thermoelectrical device 88 which is equal to the thermoelectrical device 32 according to FIG. 2c, wherein openings 66 are arranged between the deep trenches 40a, 40b, 40c and 40d of the substrate 38.

Figure 4A:
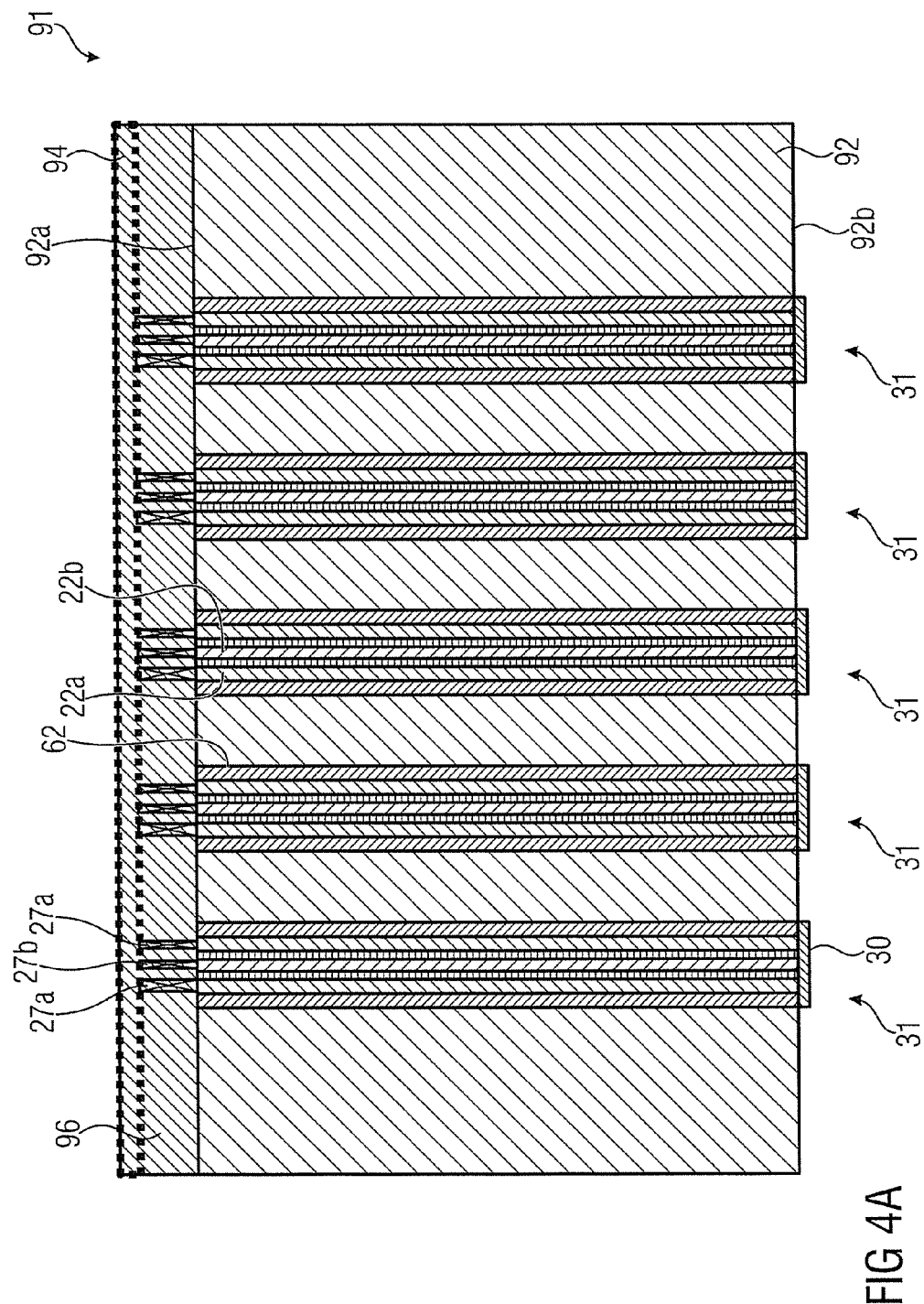
FIGS. 4a-4b schematically show embodiments of thermoelectrical devices with an embedded integrated circuit.
Figure 4B:
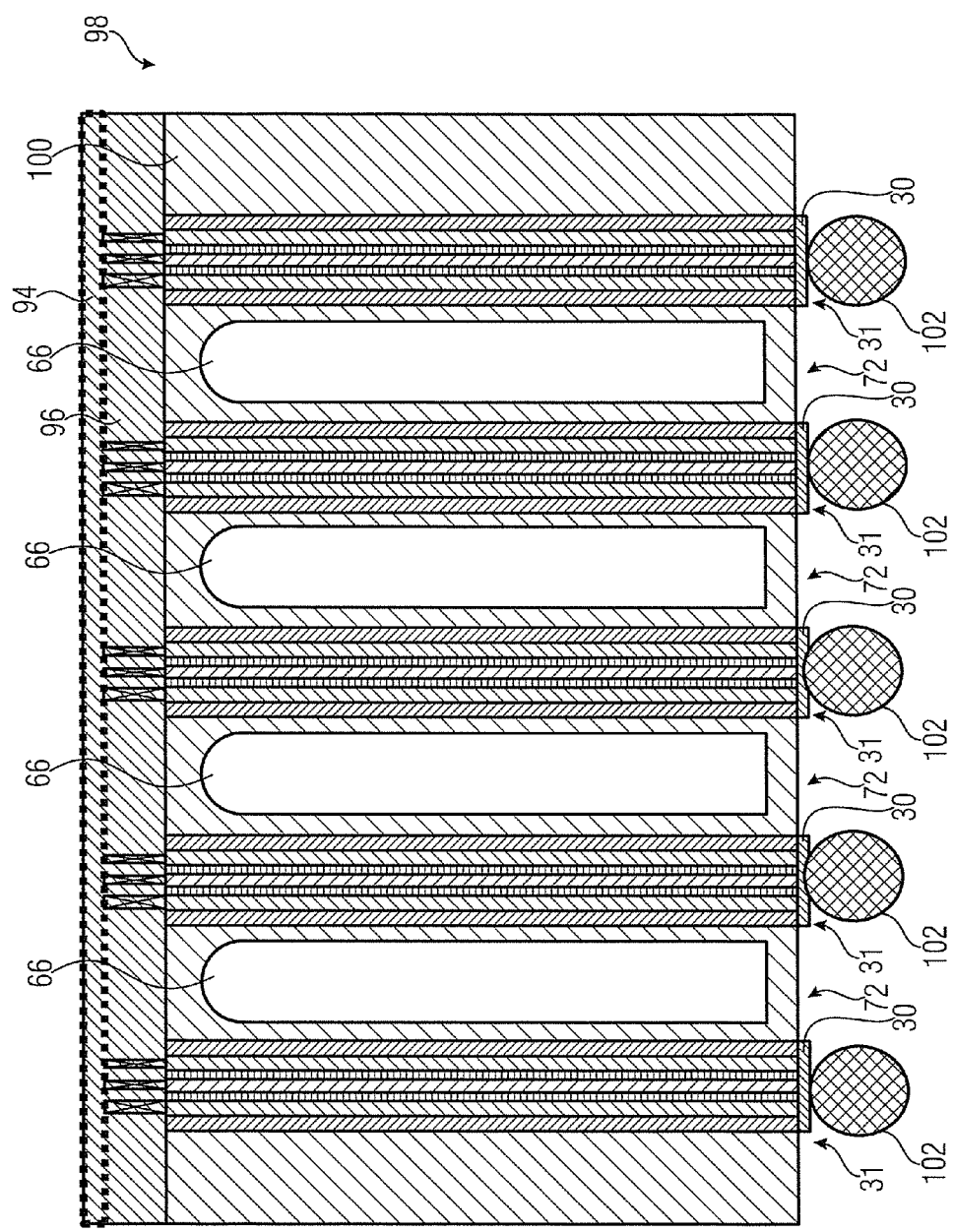

Referring to FIGS. 4a and 4b, two embodiments of thermoelectrical devices comprising an integrated circuit will be discussed.

FIG. 4a shows a cross-sectional view of a thermoelectrical device 91 which comprises a plurality of thermocouples 31 according to FIG. 2b. The five thermocouples 31 are arranged side by side (parallel to each other) within the substrate 38. In this embodiment, an integrated circuit 94 is arranged at the first main surface 38a. The integrated circuit 94 is formed on a layer 96 which is arranged on the first main surface 38a. The integrated circuit 94 is electrically connected with the five thermocouples 31 via the respective contacts 27a and 27b of the thermocouples 31 through the layer 96. The integrated or electrical circuit 94 may comprise a DC/DC converter for supplying analogue or digital functions from the electro-thermal energy, a sensor, a RF transceiver or an analogue or digital circuit. The thermoelectrical device 91 may be used as an energy harvesting system wherein the integrated circuit 94 adds the single currents of each thermocouple 31 to a total current that may be output by the integrated circuit 94.

Referring to the method for manufacturing discussed in FIG. 1, the method for manufacturing the thermoelectrical device 91 may further comprise the step arranging the integrated circuit 94 on a main surface 38a or 38b. Due to the CMOS compatibility of the thermoelectrical device 91, the integration of same and another electrical device like an integrated or electrical circuit 94 is easily possible, for example, by using CMOS processes. According to further embodiments, the method for manufacturing the thermo-electrical device 91 may comprise the following sub-steps: chemical-mechanical polishing of the wafer front side to planarize the main surface 38a; deposition of the epi layer 96 on the planarized main surface 38a and on top of the filled trenches 16; forming the integrated circuit 94 in the epi layer 96; connecting the conducting paths 22a and 22b with the integrated circuit 94 via the contacts 27a and 27b;

FIG. 4b shows a cross-sectional view of a thermoelectrical device 98 that corresponds to the thermoelectrical device 38 according to FIG. 4a, wherein the substrate 38 of the thermoelectrical device 98 comprises the openings 66 and sealings 72 according to FIG. 3b. The openings 66 and sealings 72 are arranged between the thermocouples 31. Furthermore, the thermoelectrical device 98 comprises five solder balls 102 arranged at the connecting pads 30 of the thermocouples 31. The solder balls 102 may act as a heat conductor.

Figure 5A:
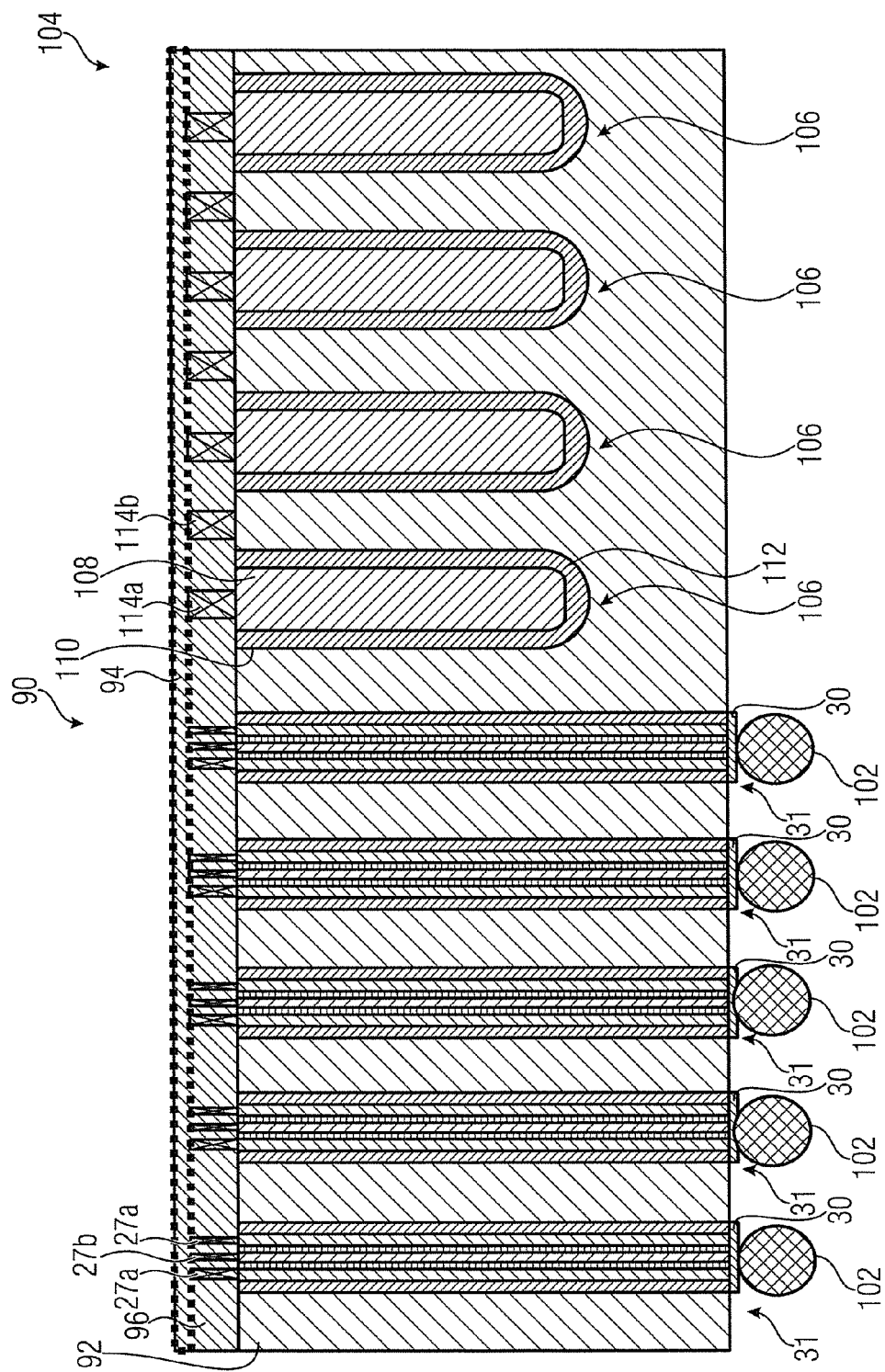
FIGS. 5a-5b schematically show embodiments of energy harvesting systems.
Figure 5B:
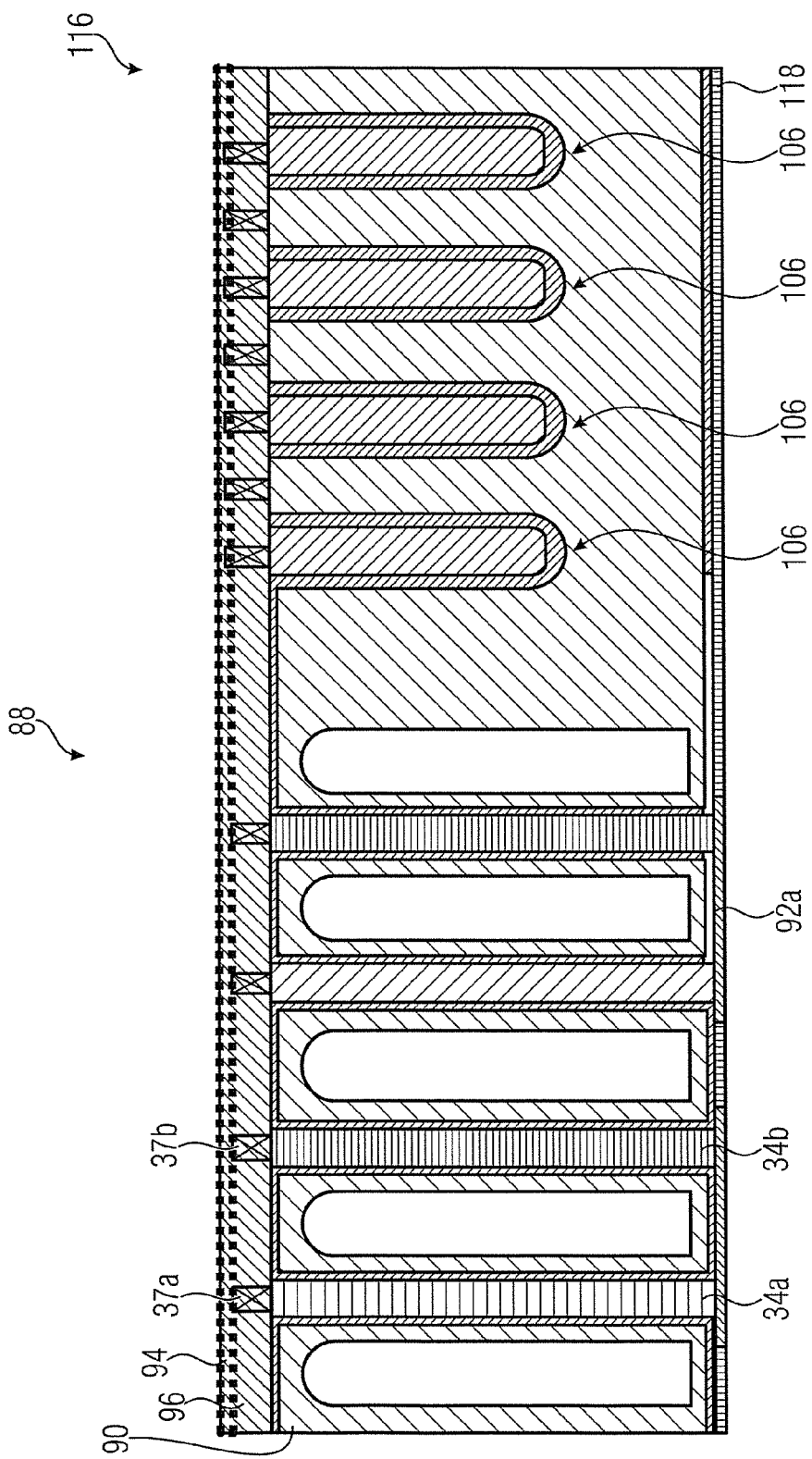

Referring to FIG. 5a and FIG. 5b two embodiments of an energy harvesting system will be discussed, wherein each embodiment comprises a thermoelectrical device according to an above embodiment and a plurality of capacitors arranged within the substrate of the thermoelectrical device.

FIG. 5a shows a cross-sectional view of an energy harvesting system 104, which comprises the thermoelectrical device 90. At the same substrate 38 of the thermoelectrical device 38 four capacitors 106, also referred to as trench capacitors, are arranged by the side of the thermoelectrical device 90. The four capacitors are formed in four parallel trenches 110 of the substrate 38, wherein each capacitor 106 comprises two electrode areas which are separated by a dielectric. A first electrode area 108 of each capacitor 106 is embedded in a respective trench 110. The electrode area 108 is isolated from the substrate 38 by a dielectric 112, wherein the common substrate 38 forms a second electrode area for the four capacitors 106. The capacitor areas 108 and the common capacitor area 92 are electrically connected with the integrated circuit 94 extending over the entire main surface 38a via contacts 114a and 114b through the insulating layer 96 and thus with the five thermocouples 31 in order to store the harvested electrical energy. The voltage of the electrical energy harvested by the five thermocouples 31 may be changed by a DC/DC converter of the integrated circuit 94 for storing the electrical energy in the capacitors 106.

According to another embodiment, the energy harvesting system 104 or, in more detail, the thermoelectrical device 90 of the energy harvesting system 104 comprises five solder balls 102 arranged on the connecting pads 30 of the thermocouples 31.

FIG. 5b shows a cross-sectional view of an energy harvesting system 116. The energy harvesting system 116 comprises the thermoelectrical device 88 according to FIG. 3g and the capacitor arrangement (comprising four capacitors 106) according to FIG. 5a. The capacitors 106 as well as the thermoelectrical device 88 are arranged side-by-side within a common substrate 38, wherein the integrated circuit 94 is arranged on same with an epi layer 96 in between. The conducting paths 34a and 34b of the thermoelectrical device 88 are electrically connected with the integrated circuit 94 via the contacts 37a and 37b. So, the thermoelectrical device 88 is electrically connected with the four capacitors 106 via the integrated circuit 94 in order to store harvested electrical energy in the capacitor arrangement. In this embodiment, the second main surface 38b is covered by an insulating layer 118, e.g. an imide layer, for isolating the substrate 38 which is used as the common second electrode area of the capacitors 106.

Referring to FIGS. 6a-6f, embodiments of thermoelectrical sensors will be discussed wherein the thermoelectrical sensors, also referred to as a thermoradiation detector, comprising a thermoelectrical device and an infrared absorbing layer.

Figure 6A:
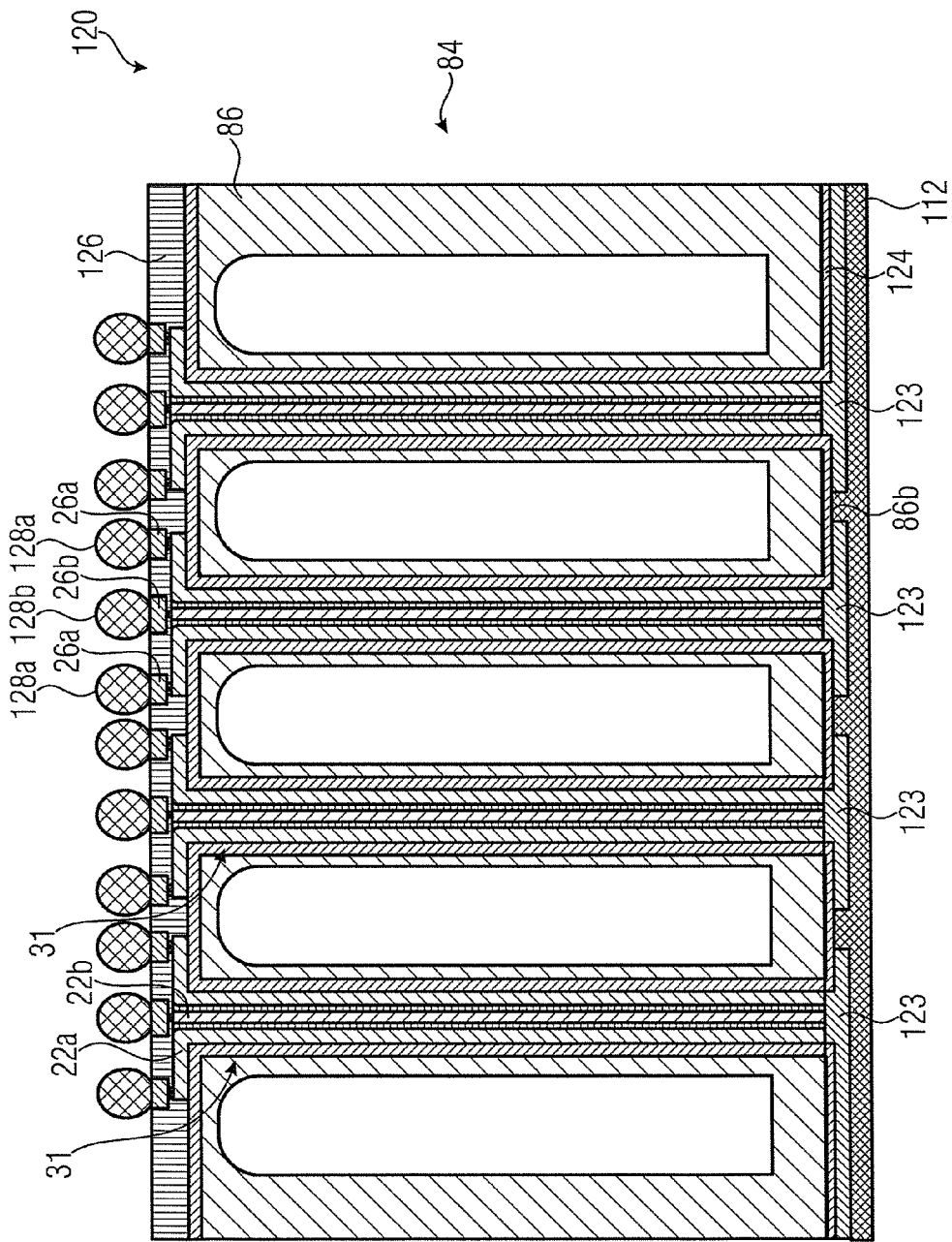
FIGS. 6a-6f schematically show different embodiments of thermosensors comprising an infrared absorbing layer.

FIG. 6a shows a cross-sectional view of a thermosensor 120 which comprises the thermoelectrical device 84 according to FIG. 3f and an infrared absorbing layer 122 at the second main surface 38b of the substrate 38. The infrared absorbing layer 122 is arranged on the connecting pads 123 which are, in contrast to the connecting pad 30 of the embodiment of FIG. 3f, enlarged. The enlarged connecting pads 123 have an anvil-shape in one embodiment such that a portion of the connecting pads 123 is spaced apart from the second main surface 38b. The substrate 38 is isolated from said portions of the connecting pads 123 and from the infrared absorbing layer 122 by an insulating layer 134. The first main surface 38a of the substrate is also isolated by an insulating layer 126, wherein the two conducting paths 22a and 22b of the thermocouples 31 are connectable via solder balls 128a and 128b which are arranged on the contact points 26a and 26b. The solder balls 128a and 128b are used as electrical contacts, e.g. to a printed circuit board.

Due to the infrared absorbing layer 122 a sensitivity of the thermosensor 120 is increased. An irradiation of the infrared absorbing layer 122 with infrared light increases the temperature at the second main surface 38b such that a temperature difference between the first main surface 38a and the second main surface 38b is generated. In response to the temperature difference or temperature gradient between the two main surfaces 38a and 38b, an electrical current can be measured between the contact points 26a and 26b or between the solder balls 128a and 128b. Based on the measured electrical current an irradiance may be determined. Regarding manufacturing, the method for manufacturing of the thermoelectrical sensor 120 is principally equal to the method for manufacturing as discussed above, but further comprises the step of arranging the infrared absorbing layer 122 on the first or second main surface 38a or 38b.

Figure 6B:
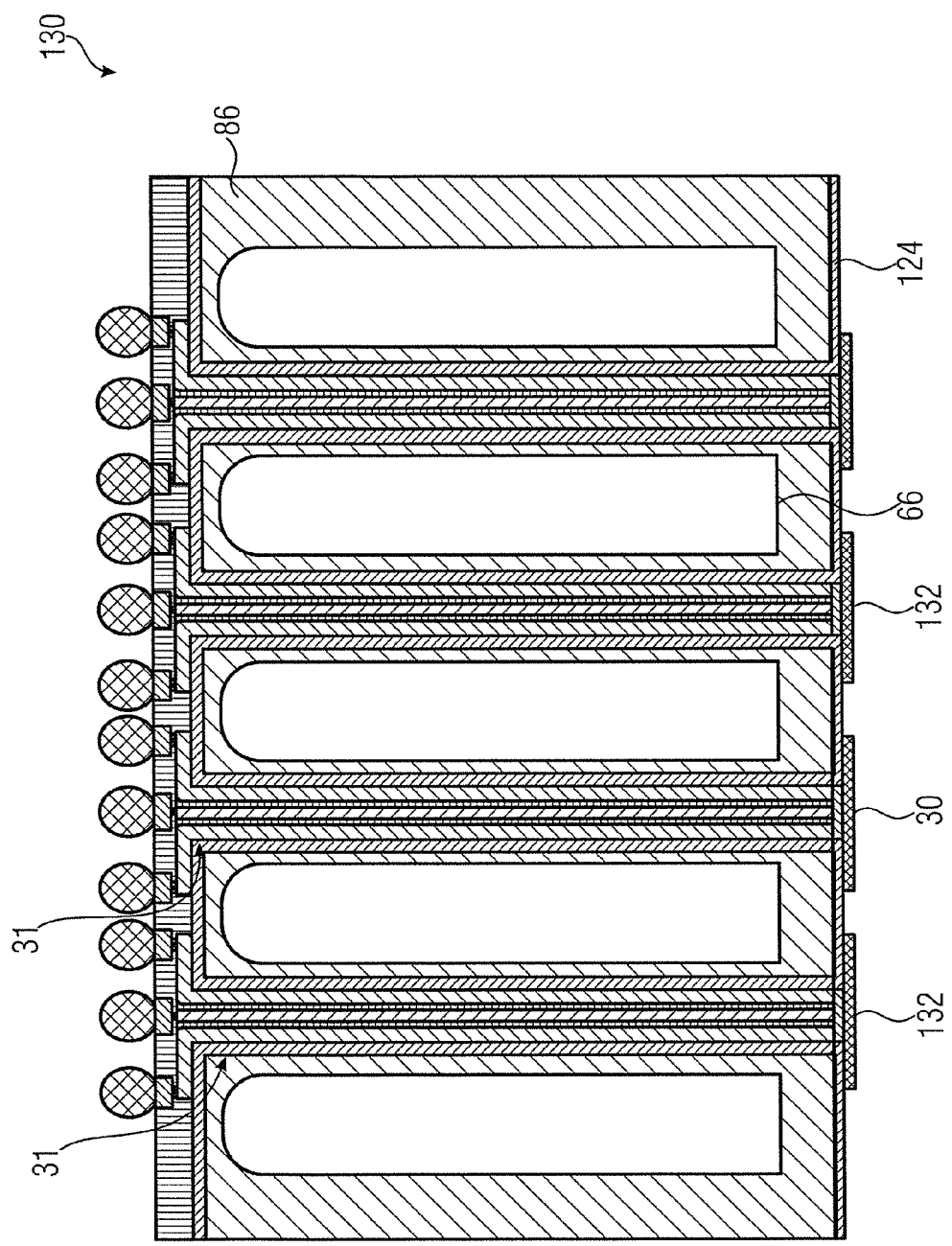

FIG. 6b shows a cross-sectional view through a thermosensor 130 which corresponds to the thermosensor 120, wherein the infrared absorbing layer 122 is divided into single infrared absorbing pixels 132 such that each thermocouple 31 forms one pixel 132. Furthermore, it should be noted that the thermocouple 31 does not comprise the anvil-shape connection pads 123, but the connecting pads 30 according to FIG. 2b.

Regarding functionality, the thermosensor 130 corresponds to the thermosensor 120, wherein the thermosensor 130 is configured to detect the irradiance of each laterally distributed pixel 132. This enables to detect lateral irradiation differences between the singular pixels 132 so that an infrared sensitive CCD with a lateral resolution is formed.

Figure 6C:
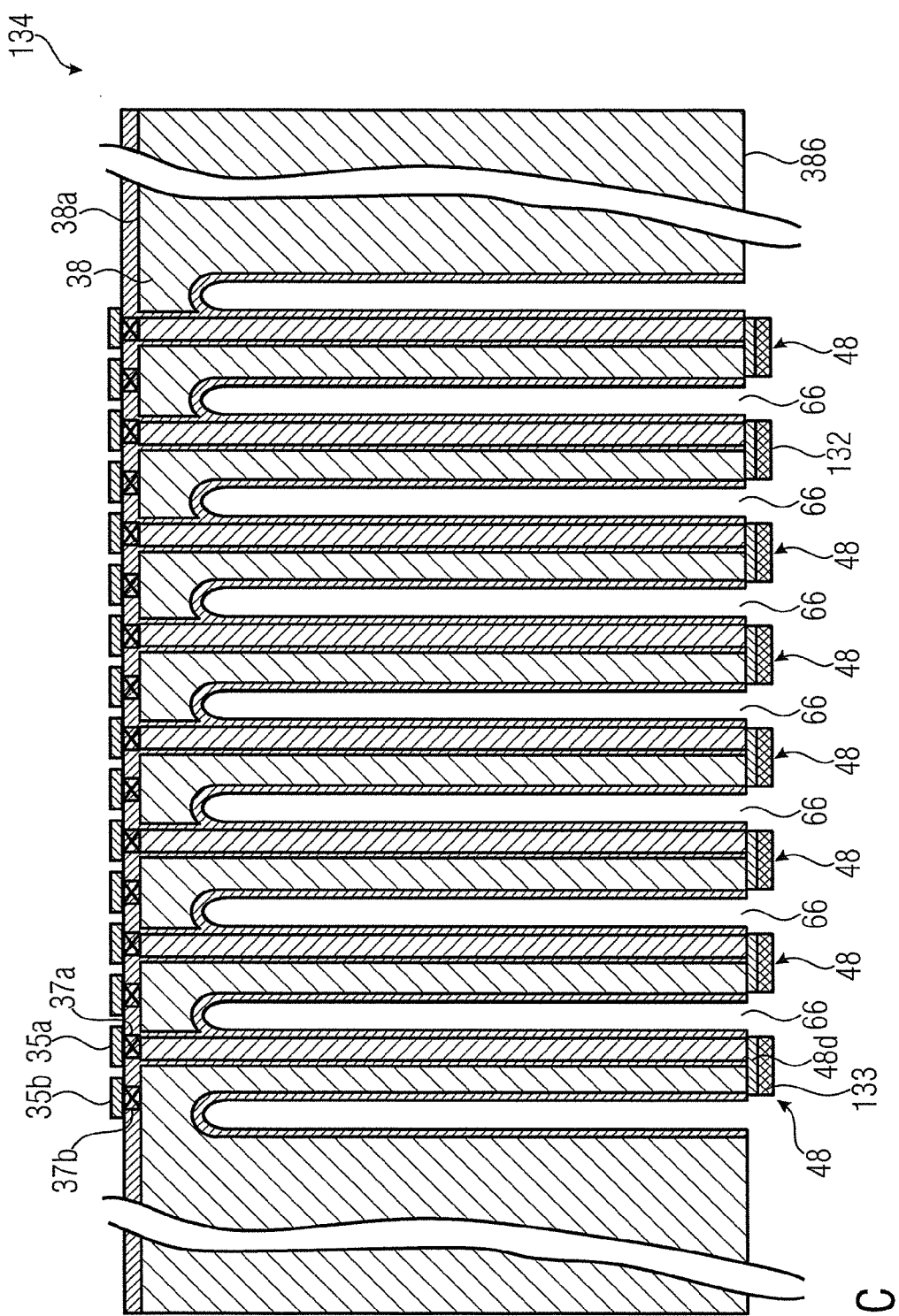

FIG. 6c shows a cross-sectional view of a thermosensor 134 which comprises a plurality of the thermocouples 48 according to FIG. 2d. In this embodiment, an infrared absorbing layer 133 is arranged on the connecting pads 48d of the thermocouples 48 so that a plurality of pixels 133 are formed. Furthermore, a plurality of openings 66 are arranged between the thermocouples 48. Thus, the sensitivity of the thermosensor 134 is improved (and the thermal conductivity decreased). The thermosensor 134 corresponds to the thermosensor 130 of FIG. 6b regarding its functionality.

Figure 6D:
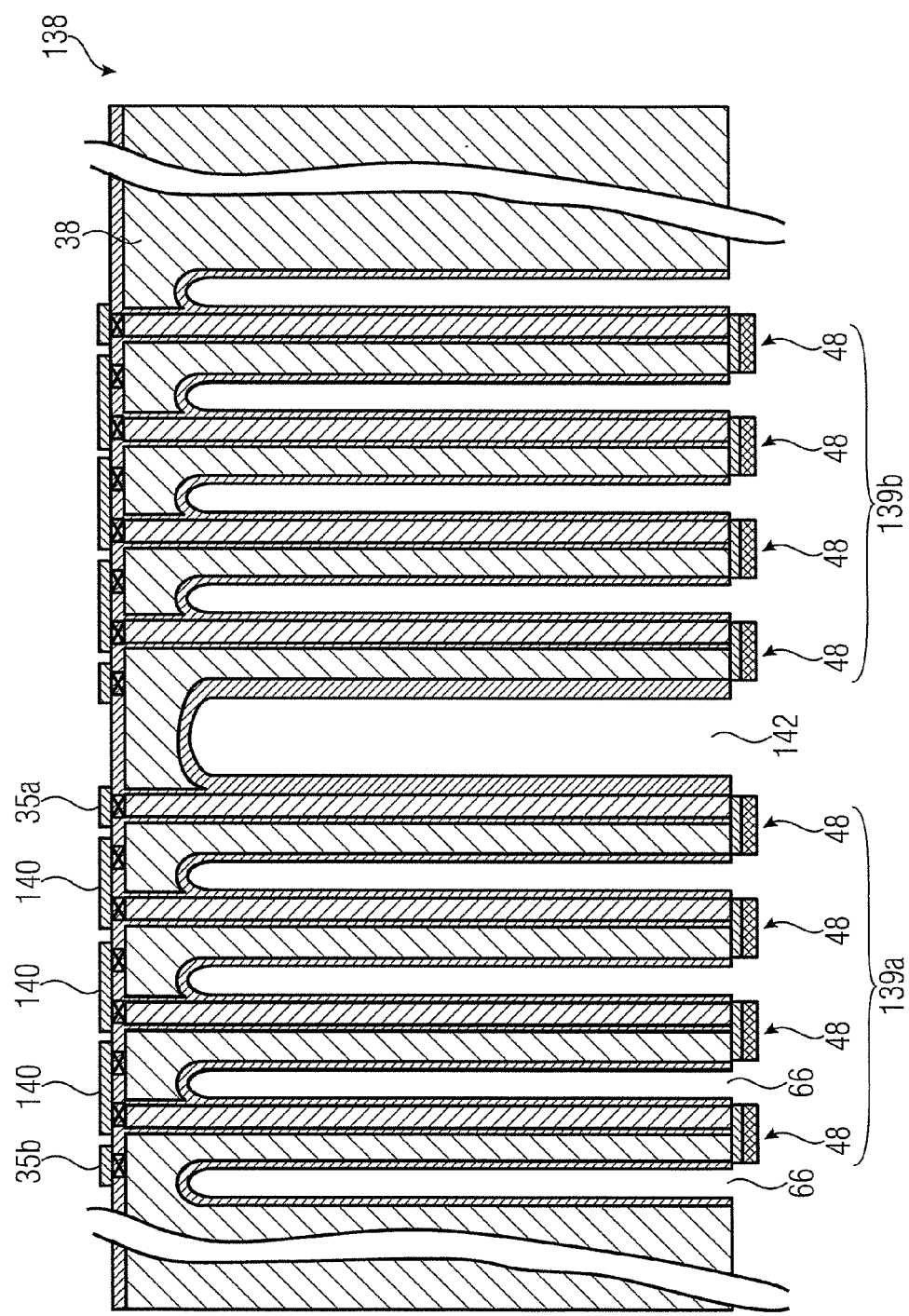

FIG. 6d shows a cross-sectional view of a thermosensor 138 which is similar to the thermosensor 134 according to FIG. 6c. The thermosensor 138 comprises eight thermocouples 48, wherein four thermocouples 48 each are grouped. Each group 139a and 139b forms a pixel of the thermosensor 138. Within each group 139a and 139b the four thermocouples 48 are connected in series by connections 140. The connection 140 are arranged between the first and the second, the second and the third, the third and the fourth thermocouple 48 instead of six of the eight contact points 35a and 35b. This serial connection of the thermocouples 48 increases the output signal of each group (pixel) 139a and 139b. The two groups 139a and 139b are separated by a deep trench 142, wherein the deep trench 142 is laterally enlarged compared to the openings 66.

Figure 6E:
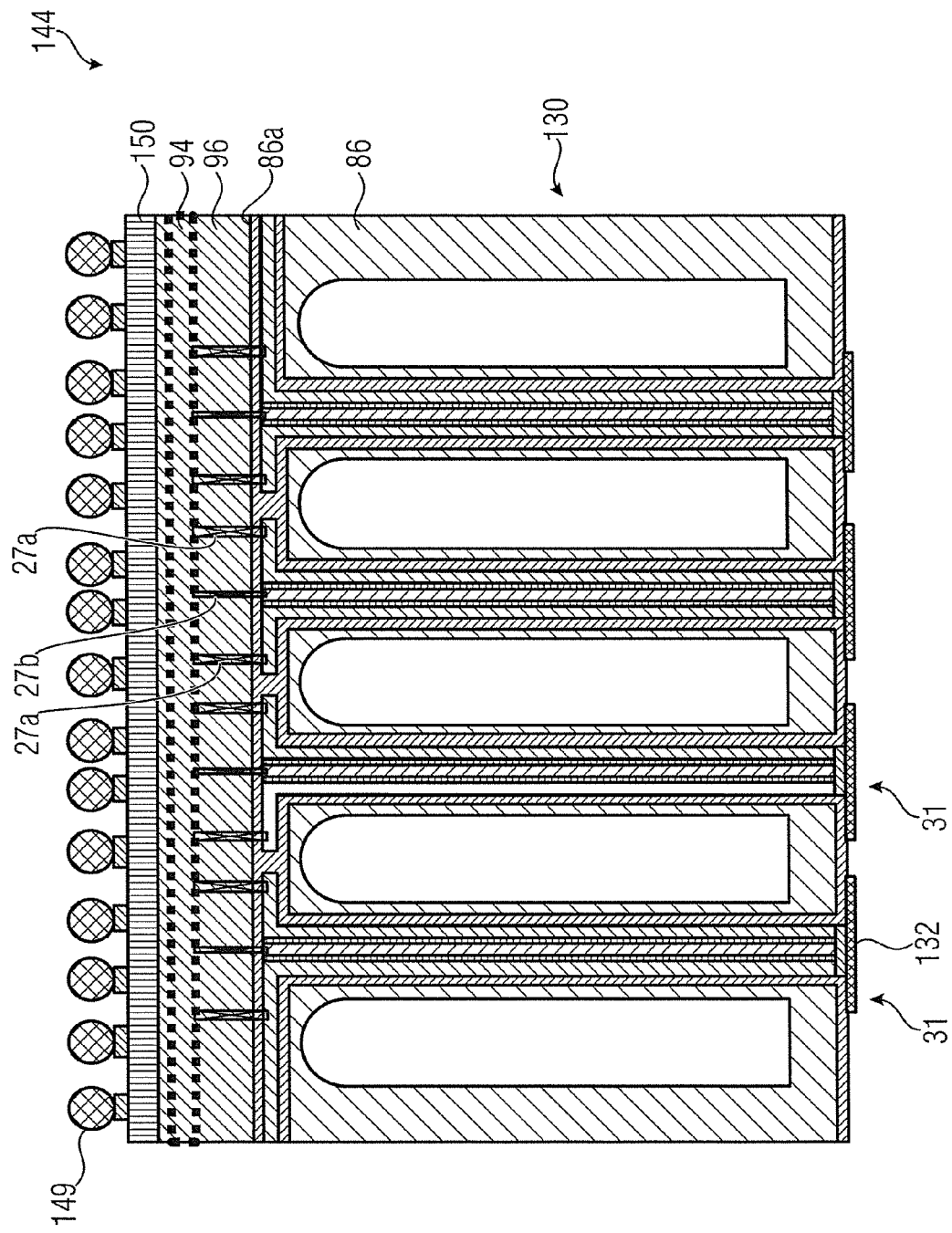

FIG. 6e shows a cross-sectional view of a thermosensor 144 which corresponds to the thermosensor 130 according to FIG. 6b, but further comprises the integrated circuit 94 arranged at the first main surface 38a of the substrate 38. The integrated circuit 94 is formed in the epi layer 96 which is arranged on the first main surface 38a. The integrated circuit 94 is electrically connected to the thermocouples 31 via the contacts 27a and 27b. The integrated circuit 94 is connectable via contacts having solder balls 139. The contacts 149 are arranged on the integrated circuit 94 with an insulating layer 150 in between. The integrated circuit 94 may be an evaluation circuit and may be used to process the information of each pixel 132 or for amplifying and process the signal of the pixels 132.

Figure 6F:
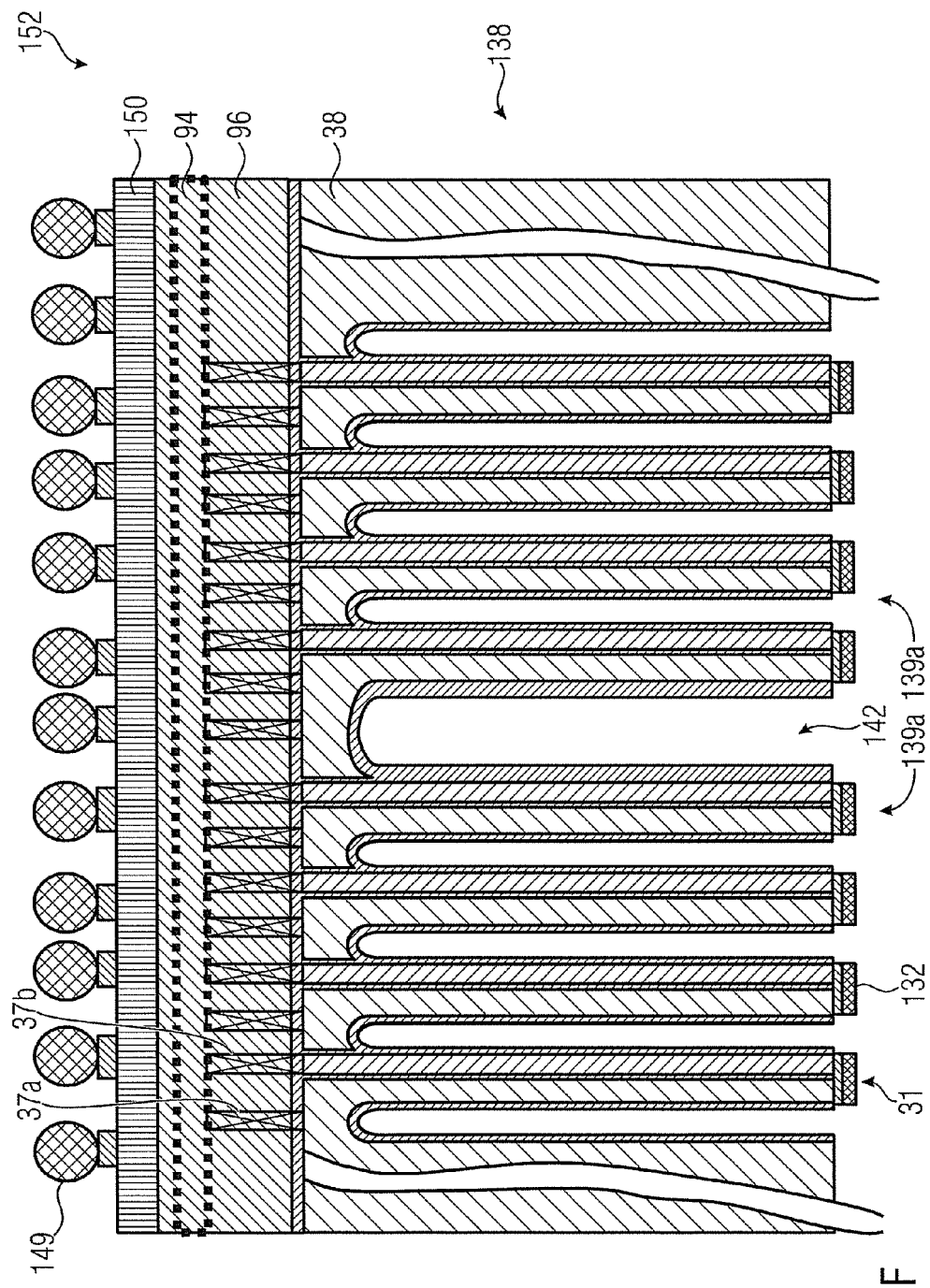

FIG. 6f shows a cross-sectional view of a thermosensor 152, which comprises the thermosensor 138 according to FIG. 6d and the integrated circuit 94 according to FIG. 6e. The integrated circuit 94 is formed in an epi layer 96 which is arranged on the first main surface 38a of the substrate 38. The thermocouples 48 are electrically connected with the integrated circuit 94 via the contacts 37a and 37b. Furthermore, the contacts 149 as well as the insulating layer 150 are arranged at the integrated circuit 94 according to FIG. 6e.

Referring to FIGS. 7a to 7f different embodiments of thermoelectrical device which may be used as a heat transfer device, also referred to as the Peltier element, will be discussed.

Figure 7A:
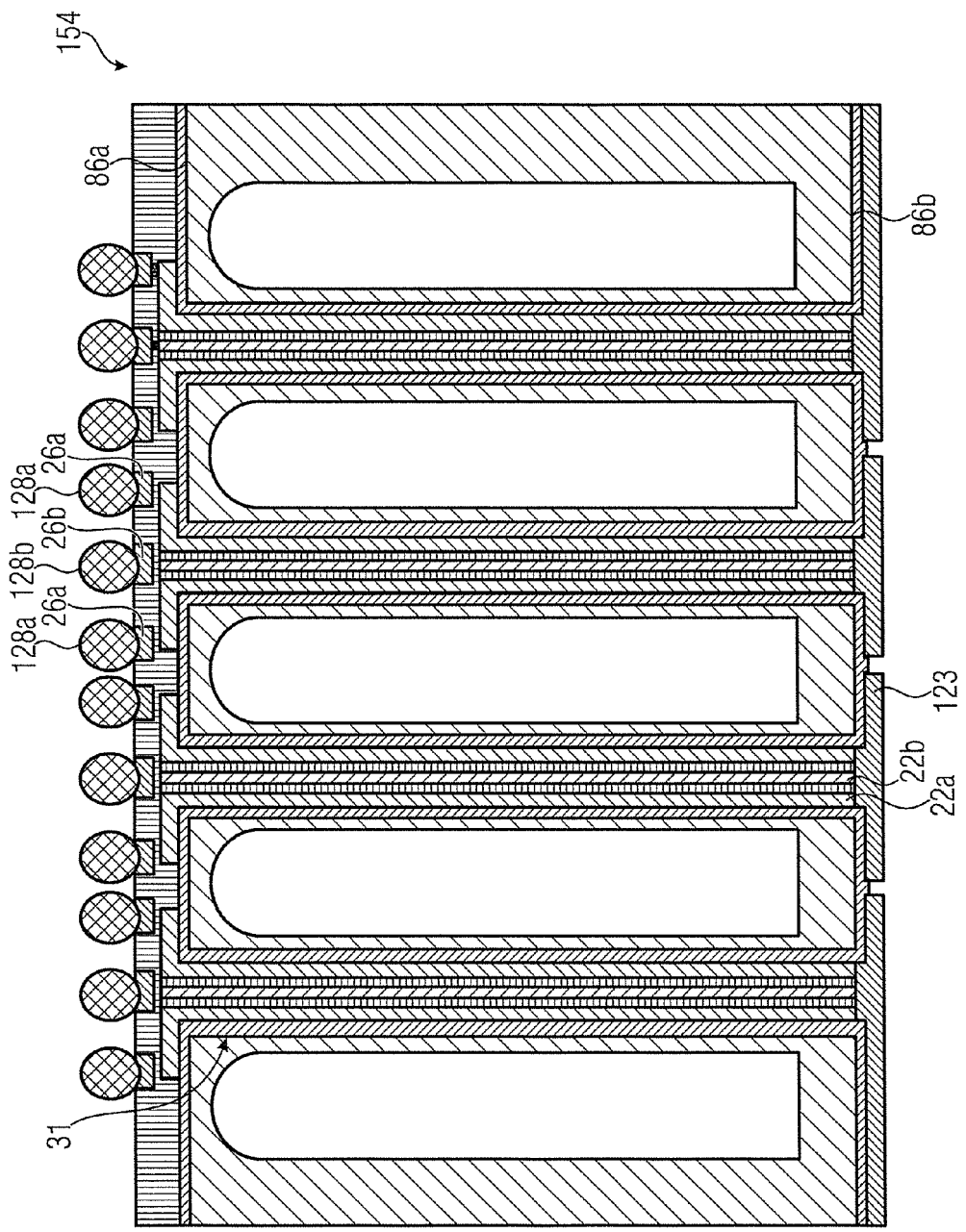
FIGS. 7a-7f schematically show different embodiments of heat transfer devices.

FIG. 7a shows a cross-sectional view of a heat transfer device 154 which is equal to the thermoelectrical device 120 according to FIG. 6a, wherein the heat transfer device 154 does not comprise the infrared absorbing layer 122. The heat transfer device 154 is configured to generate a temperature difference Δt between the first main surface 38a and the second main surface 38b in response to an applied current between the first and the second conducting paths 22a and 22b of the thermocouple 31. This current may be applied via the contact 26a, 26b and via the solder balls 128a, 128b, respectively. In other words, when an electrical current flows through the thermocouple 31 formed by the first and second conducting paths 22a and 22b and the connecting pad 123 heat is released at the upper junction and absorbed at the lower junction. The direction of the heat transfer from the first main surface 38a to the second surface 38b or vice versa depends on the sign of current.

Figure 7B:
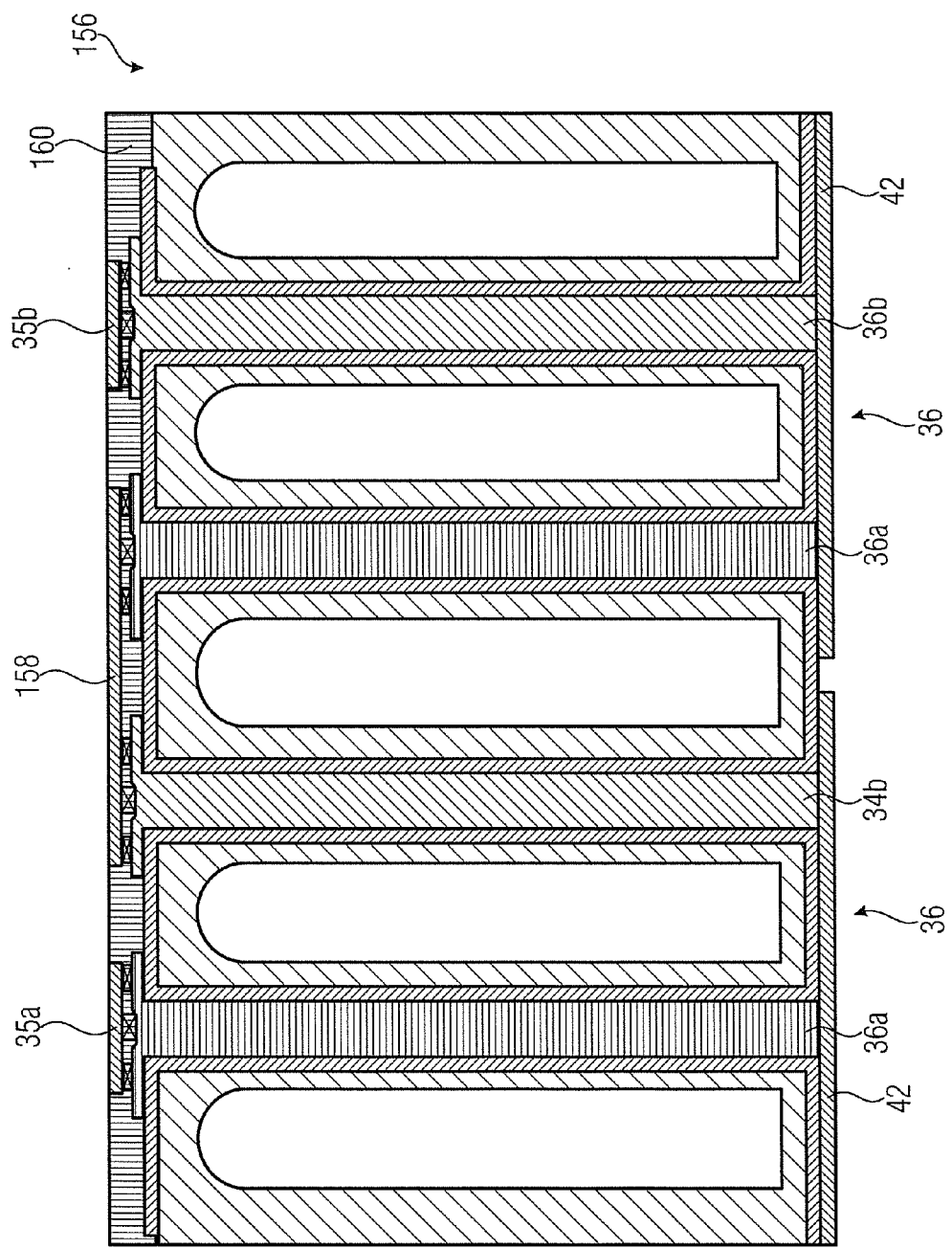

FIG. 7b shows a cross-sectional view of a heat transfer device 156 which corresponds to the thermoelectrical device 88 according to FIG. 3a wherein the second conducting path 34b of the first thermocouple 34 and the first conducting path 36a of the thermocouple 36 are electrically connected via a connection 158. The connection 158 is arranged instead of the contact points 35a and 35b. Furthermore, the first main surface 38a is covered by an insulating layer 160 such that the connection 158 and the contact points 35a and 35b of the conducting paths 36a and 36b are embedded in the insulating layer 116. Furthermore, the connecting pads 42 are enlarged in contrast to the contact pads 42 as shown in FIG. 3g. The heat transfer device 158 corresponds to the heat transfer device 154 regarding its functionality.

Figure 7C:
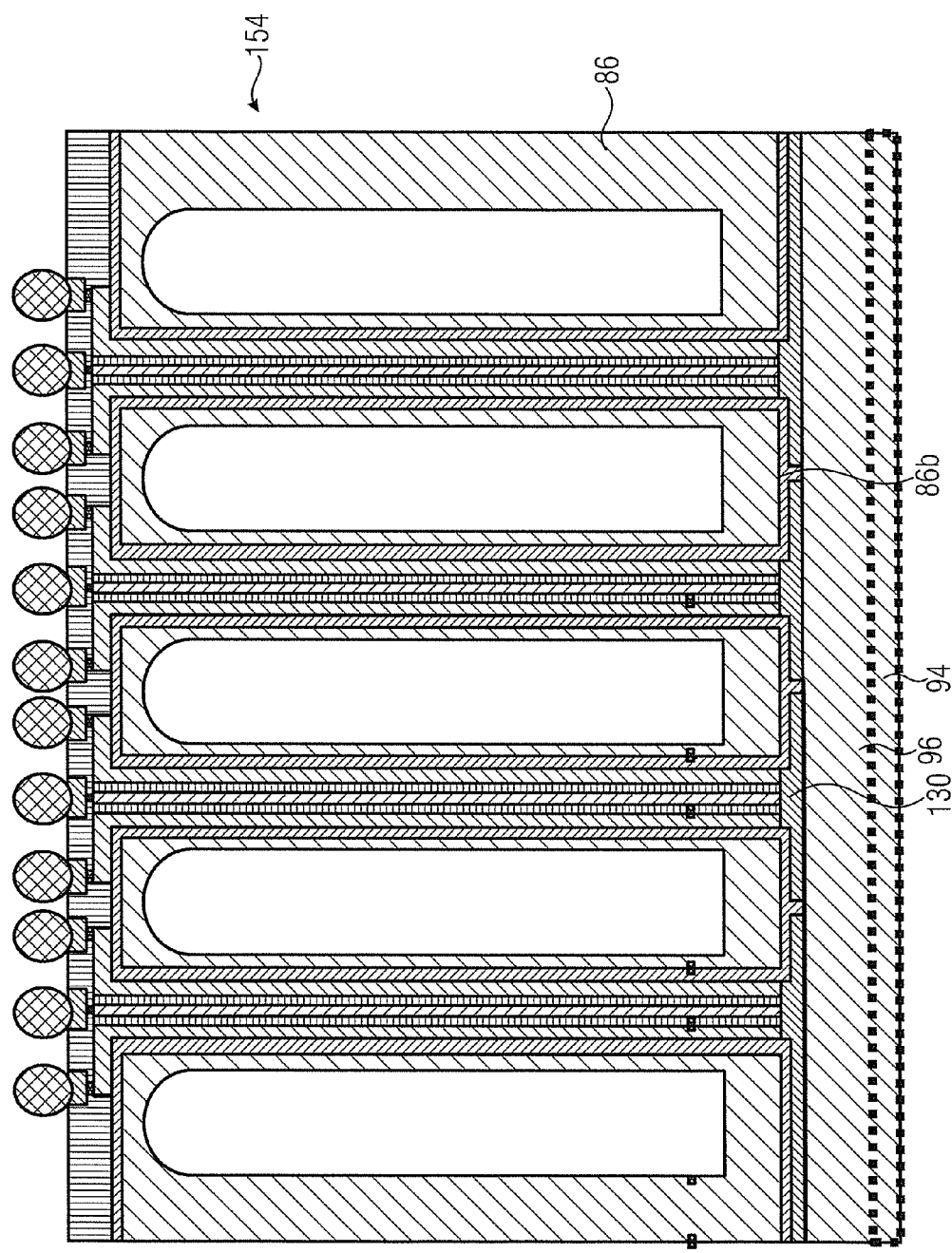

FIG. 7c shows a cross-sectional view of a combination of the heat transfer device 154 according to FIG. 7a and an integrated circuit implemented on a single chip. The integrated circuit 94 is formed in an epi layer 96 at the second main surface 38b of the substrate 38. The epi layer 96 is arranged on the connecting pads 130. In this embodiment, the integrated circuit 94 may be cooled or heated or kept at a constant temperature due to the heat transfer device 154. In another embodiment, an integrated circuit 94 may comprise a chemical sensor that needs an elevated temperature for proper functionality.

Figure 7D:
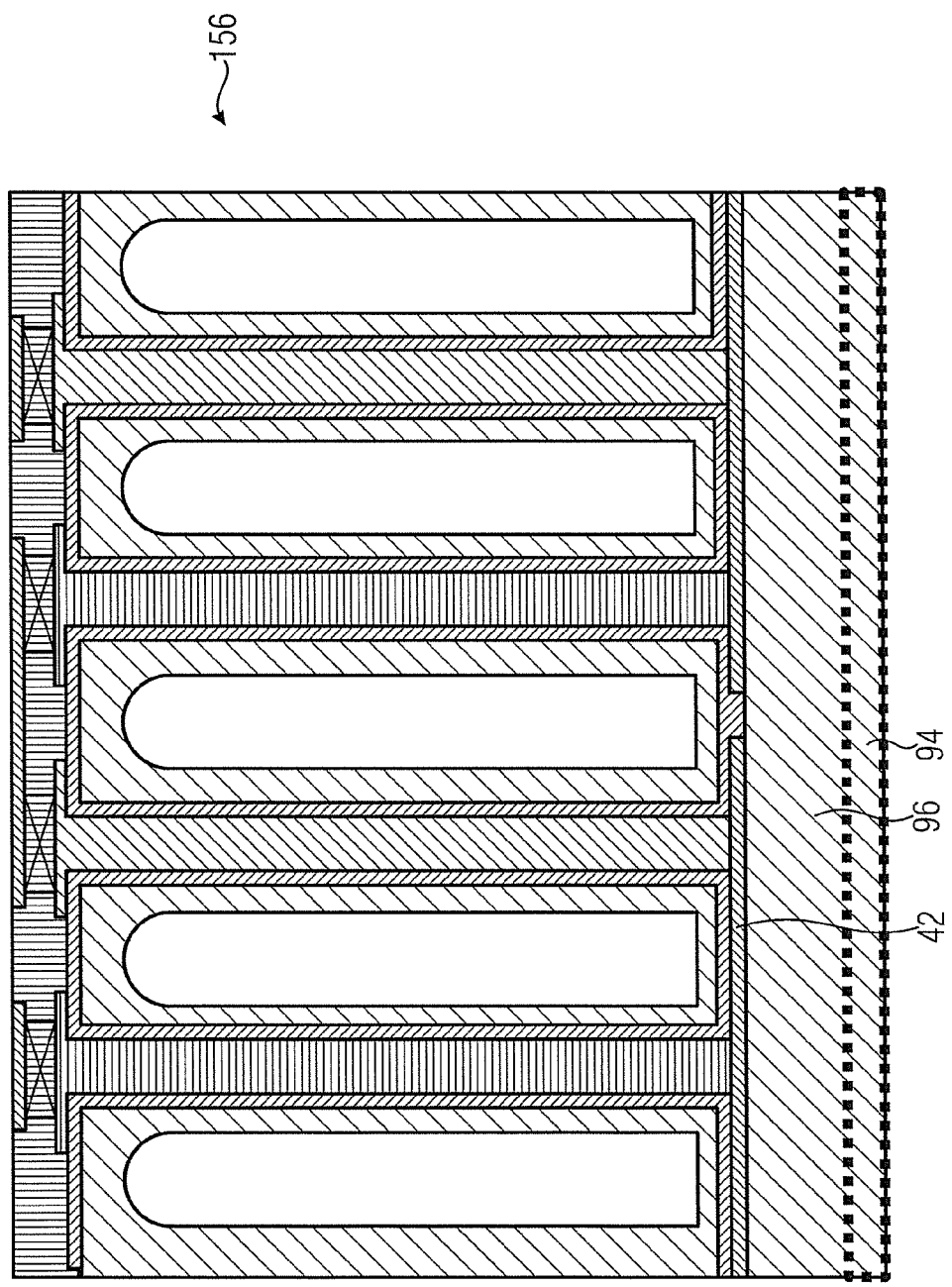

FIG. 7d shows a cross-sectional view of a combination of the heat transfer device 156 according to FIG. 7b and the integrated circuit 94 implemented on a single chip. The integrated circuit 94 is formed in the epi layer 96 which is arranged on the connecting pads 42 for heating or cooling the integrated circuit 94.

Figure 7E:
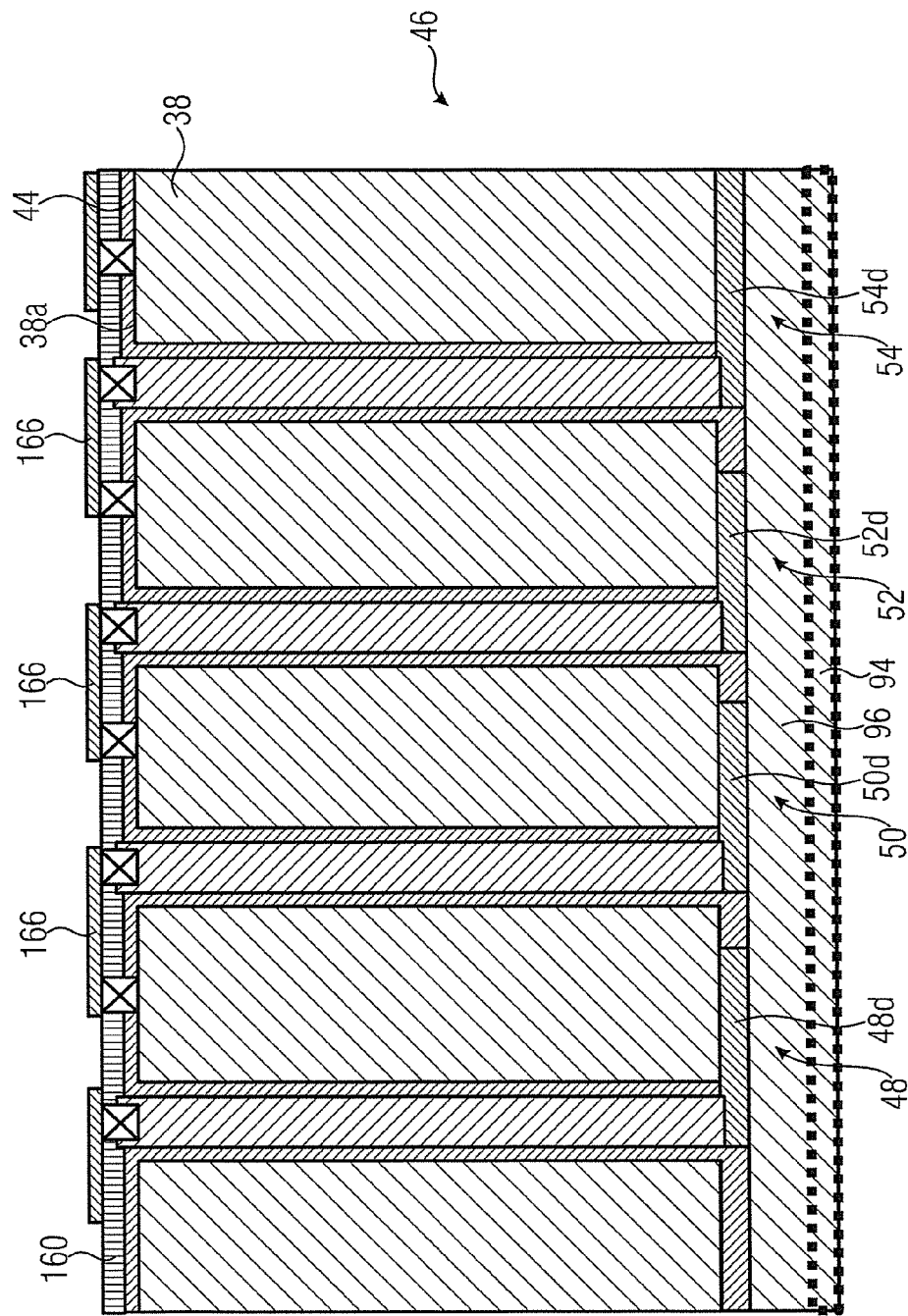

FIG. 7e shows a cross-sectional view of an embodiment which comprises a combination of a heat transfer device 46 according to FIG. 2d and an integrated circuit 94 implemented on a single chip. In this embodiment, the epi layer 96 and thus the integrated circuit 94 formed in same are arranged on the connecting pads 48d, 50d, 52d and 54d of a thermoelectrical device 46 at the first main surface 38a. In this embodiment, the thermocouples 48, 50, 52 and 54 are connected in series via connections 166. According to FIG. 7b, an insulating layer 160 is provided at the first main surface 38a of the substrate 38 such that the insulating layer 44 is covered.

Figure 7F:
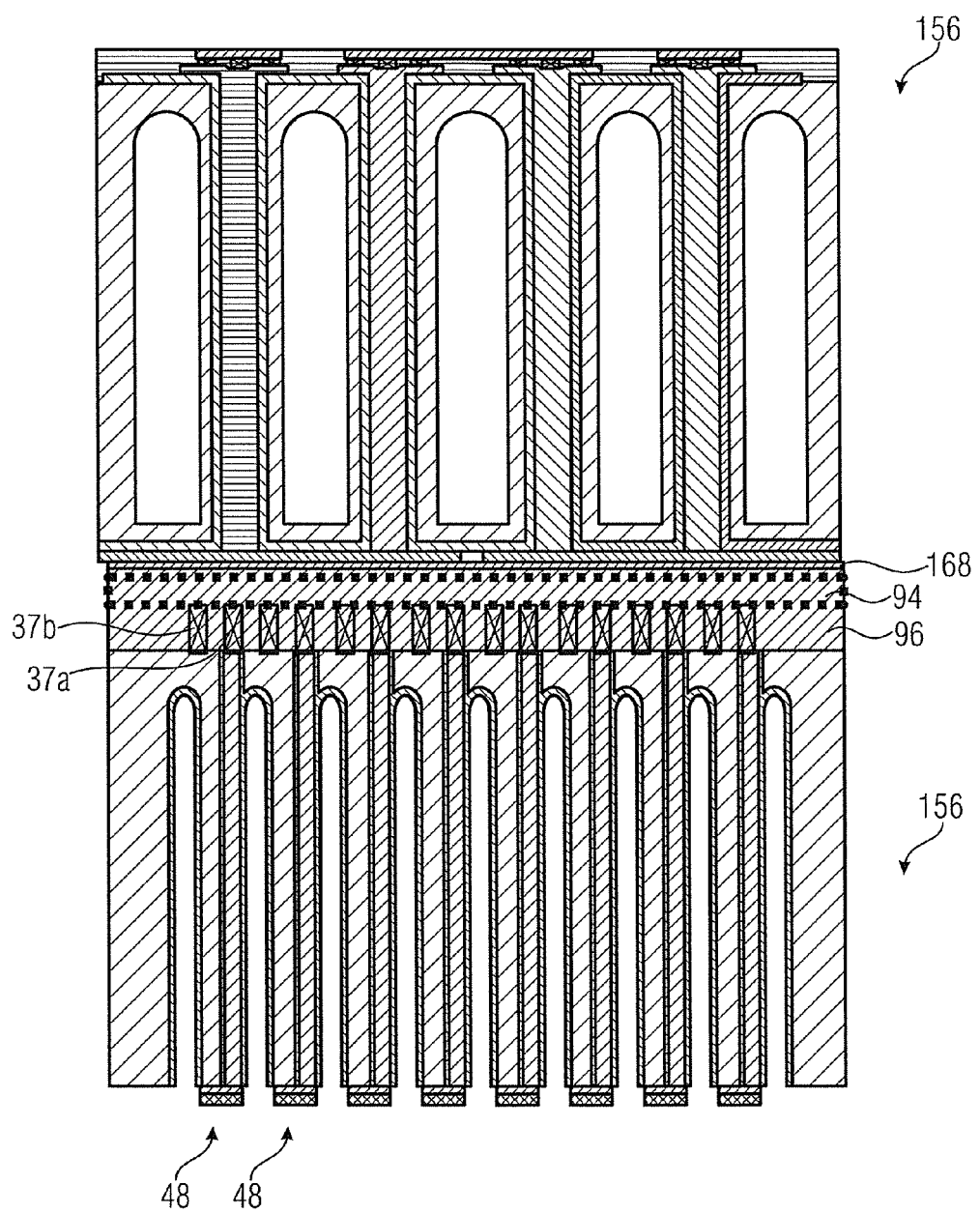

FIG. 7f shows a cross-sectional view of a combination of the heat transfer device 156 according to FIG. 7e and the thermosensor 134 according to FIG. 6c. The thermosensor 134 is arranged at the connecting pads 42 of the heat transfer device 156, wherein the integrated circuit 94 is arranged in between. The integrated circuit 94 is formed in an epi layer 96 and electrically connected with the conducting paths of the thermocouples 48 via the contacts 37a and 37b. The integrated circuit 94 may be configured to process the information of each pixel of the thermosensor 134 or to amplify the signal of the pixels. The heat transfer device 156 may be used for cooling the thermocouples 48 (and/or the integrated circuit 94). Hence, the sensitivity of the thermosensor 134 is increased. Between the integrated circuit 94 and the heat transfer device 158 an insulating layer 168 may be provided.

Referring to FIG. 1, the method for manufacturing the thermoelectrical device comprising the two thermoelectrical devices 156 and 134 further comprises a step of arranging a further thermoelectrical device on the first main surface or on the second main surface of the respective thermoelectrical device.

According to further embodiments, a thermoelectrical device may comprise a stack of heat transfer devices according to the above embodiments in order to increase the heat transfer. In above embodiments, the stacked devices are implemented on a single chip using deep trench etching technologies.

Also, in the above embodiments some aspects have been described in context of a thermoelectrical device comprising one or more trenches or deep trenches, it is clear that these aspects also represent a description of the corresponding method for manufacturing same, where a block or a device corresponds to a method step or a feature of a method step. Analogously, aspects described in the context of a method step also represent a description of a corresponding block, item or feature of a corresponding thermoelectrical device.

The above described embodiments are merely illustrative for the principles of the present invention. It is understood that modifications and variations of the arrangements and the detailed description will be apparent to others skilled in the art. It is the invention, therefore, to be limited only by the scope of the impending patent claims and not by the specific details present by way of description and explanation of the embodiments herein.

Referring to FIG. 2c, the plurality of thermocouples 22 may alternatively be connected in series to increase the output voltage.

Referring to the method of manufacturing the thermoelectrical device 32 according FIG. 2c, the plurality of deep trenches 40a, 40b, 40c and 40d may, alternatively, be provided into the substrate 38 such that the same extend over the whole thickness 38t of the substrate 38 before filling the trenches 40a, 40b, 40c and 40d with the insulating and conducting material.

Referring to FIG. 3a and FIG. 3c, it should be noted that the openings 66 and the fill 76 are not necessarily arranged between two deep trenches 16. Alternatively, they may be arranged in an area of the substrate 38 in which no thermocouple is arranged between the first and the second main surface 38a and 38b.

The invention claimed is:

1. A method for manufacturing a thermoelectrical device, the method comprising:
    providing a substrate;
    forming at least one deep trench comprising a cavity into the substrate, after providing the substrate; and
    forming at least one thermocouple which comprises two conducting paths after forming the deep trench, wherein a first conducting path comprises a first conductive material and a second conducting path comprises a second conductive material, such that at least the first conducting path is embedded in the deep trench of the substrate;
    wherein the two conducting paths are directly electrically connected at the bottom of the deep trench by a material-junction of the two conducting paths, and wherein the two conducting paths are isolated from each other along the deep trench with exception of the material-junction, and wherein the material-junction comprises an interface wherein a surface of the first conducting path is in direct contact with a surface of the second conducting path;
    wherein forming the thermocouple is performed such that the first and the second conducting path are embedded in the deep trench and such that the second conducting path is surrounded by the first conducting path; wherein the two conducting paths are isolated by an insulating layer along a length of at least one of the two conducting paths and the two conducting paths are electrically connected at an end portion of one of the two conducting paths residing at a bottom portion of the deep trench.

2. The method for manufacturing the thermoelectrical device according to claim 1, wherein forming the deep trench is performed such that a ratio of a depth and a diameter of the deep trench is larger than 5:1.

3. The method for manufacturing the thermoelectrical device according to claim 1, wherein forming the deep trench comprises etching into the substrate such that the deep trench extends from a first main surface of the substrate over at least 90% of a thickness of the substrate.

4. The method for manufacturing the thermoelectrical device according to claim 1, wherein forming the at least one thermocouple comprises:
    depositing an insulating layer in the deep trench; and
    depositing or filling at least the first conductive material into the deep trench after depositing the insulating layer.

5. The method for manufacturing the thermoelectrical device according to claim 3, further comprising:
    etching a second main surface of the substrate opposite the first main surface such that the first and second conducting paths are exposed at the second main surface; and
    arranging a metal connection pad for electrically connecting the two conducting paths at the second main surface.

6. The method for manufacturing the thermoelectrical device according to claim 5, the method further comprising forming a further deep trench into the substrate such that the further deep trench extends over an entire thickness of the substrate; and
    wherein forming the thermocouple comprises embedding the second conducting path in the further deep trench of the substrate.

7. The method for manufacturing the thermoelectrical device according to claim 1, the method further comprising:
    forming a plurality of said deep trenches; and
    etching a second main surface of the substrate opposite the first main surface such that an opening is laterally arranged between at least two of the plurality of deep trenches.

8. The method for manufacturing the thermoelectrical device according to claim 7, further comprising filling the opening with a material that has a reduced thermal conductivity when compared to a thermal conductivity of the substrate.

9. The method for manufacturing the thermoelectrical device according to claim 1, further comprising:
    forming a plurality of said deep trenches;
    forming a plurality of said thermocouples associated, respectively, with the plurality of deep trenches; and
    electrically connecting at least two thermocouples together in series.

10. The method for manufacturing the thermoelectrical device according to claim 1, further comprising arranging an infrared absorbing layer on the first main surface or on a second opposing main surface of the substrate such that a thermoelectrical sensor is formed.

11. The method for manufacturing the thermoelectrical device according to claim 10, further comprising:
    forming a plurality of said deep trenches;
    forming a plurality of said thermocouples comprising the infrared absorbing layer associated, respectively, with the plurality of deep trenches; and
    separating the plurality of thermocouples by at least one additional deep trench extending from the first main surface such that one or more pixels of the infrared sensor are formed.

12. The method for manufacturing the thermoelectrical device according to claim 1, further comprising arranging an integrated circuit on the first main surface or on a second opposing main surface of the substrate of the thermoelectrical device.

13. The method for manufacturing the thermoelectrical device according to claim 1, further comprising arranging a further thermoelectrical device on the first main surface or on a second opposing main surface of the substrate.

14. The method of claim 1,
   wherein the substrate comprises an integrated contiguous substrate of a single material, and
   wherein forming the at least one deep trench into the substrate comprises selectively removing portions of the material of the substrate.

15. The method of claim 1, wherein forming the at least one thermocouple comprises:
   depositing a first insulating layer in the deep trench;
   depositing the first conductive material into the deep trench after depositing the first insulating layer;
   depositing a second insulating layer into the deep trench after depositing the first conductive material;
   depositing or filling the deep trench with the second conductive material; and
   electrically connecting the first conductive material and the second conductive material.

16. A method for manufacturing a thermoelectrical device, the method comprising:
   providing a substrate;
   forming at least one deep trench into the substrate; and
   forming at least one thermocouple which comprises two conducting paths, wherein a first conducting path comprises a first conductive material and a second conducting path comprises a second conductive material, such that at least the first conducting path is embedded in the deep trench of the substrate;
   wherein the two conducting paths are directly electrically connected at the bottom of the deep trench by a material-junction of the two conducting paths, and wherein the two conducting paths are isolated from each other along the deep trench with exception of the material-junction, and wherein the material-junction comprises an interface wherein a surface of the first conducting path is in direct contact with a surface of the second conducting path;
   wherein forming the thermocouple is performed such that the first and the second conducting path are embedded in the deep trench and such that the second conducting path is surrounded by the first conducting path; wherein the two conducting paths are isolated by an insulating layer along a length of one of the conducting paths and the two conducting paths are electrically connected at an end portion of the one of the conducting paths residing at a bottom portion of the deep trench;
   wherein forming the at least one thermocouple comprises:
   depositing an insulating layer in the deep trench; and
   depositing or filling at least the first conductive material into the deep trench after depositing the insulating layer.

* * * * *